United States Patent
Hush

(10) Patent No.: US 10,388,360 B2
(45) Date of Patent: Aug. 20, 2019

(54) UTILIZATION OF DATA STORED IN AN EDGE SECTION OF AN ARRAY

(71) Applicant: Micron Technology, Inc., Boise, ID (US)

(72) Inventor: Glen E. Hush, Boise, ID (US)

(73) Assignee: Micron Technology, Inc., Boise, ID (US)

(*) Notice: Subject to any disclaimer, the term of this patent is extended or adjusted under 35 U.S.C. 154(b) by 141 days.

(21) Appl. No.: 15/213,755

(22) Filed: Jul. 19, 2016

(65) Prior Publication Data

US 2018/0025768 A1    Jan. 25, 2018

(51) Int. Cl.
*G11C 29/52*    (2006.01)
*G11C 11/4091*  (2006.01)
(Continued)

(52) U.S. Cl.
CPC ...... *G11C 11/4091* (2013.01); *G06F 11/1048* (2013.01); *G11C 5/025* (2013.01);
(Continued)

(58) Field of Classification Search
CPC ....... G11C 2207/06; G11C 7/06; G11C 7/065; G11C 11/4091; G11C 11/4096
See application file for complete search history.

(56) References Cited

U.S. PATENT DOCUMENTS 4,380,046 A    4/1983 Fung
4,435,792 A    3/1984 Bechtolsheim
(Continued)

FOREIGN PATENT DOCUMENTS

CN    102141905    8/2011
EP    0214718      3/1987
(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing—Issues in embedded single-chip multicore architectures.
(Continued)

*Primary Examiner* — Gene N Auduong
(74) *Attorney, Agent, or Firm* — Brooks, Cameron & Huebsch, PLLC

(57) ABSTRACT

An example apparatus includes a memory device having first sensing circuitry positioned adjacent an edge of an edge array section and selectably coupled to a row memory cells, the first sensing circuitry including a first sense amplifier selectably coupled via a first sense line to a first memory cell in the row and via a second sense line to the first memory cell. The example apparatus includes second sensing circuitry positioned at an opposite edge of the edge array section and selectably coupled to the row via a third sense line, the second sensing circuitry including a second sense amplifier selectably coupled via the third sense line to a second memory cell in the row. The example apparatus further includes a component positioned outside the edge array section and proximate the first sensing circuitry, the component configured to perform an operation based on data sensed by the first sensing circuitry.

9 Claims, 13 Drawing Sheets

(51) Int. Cl.
| | | |
|---|---|---|
| *G11C 11/4096* | (2006.01) | |
| *G11C 5/02* | (2006.01) | |
| *G11C 7/10* | (2006.01) | |
| *G11C 11/4094* | (2006.01) | |
| *G11C 11/4097* | (2006.01) | |
| *G06F 11/10* | (2006.01) | |
| *G11C 29/04* | (2006.01) | |

(52) U.S. Cl.
CPC .......... *G11C 7/1006* (2013.01); *G11C 7/1036* (2013.01); *G11C 11/4094* (2013.01); *G11C 11/4096* (2013.01); *G11C 11/4097* (2013.01); *G11C 29/52* (2013.01); *G11C 2029/0411* (2013.01)

(56) References Cited

U.S. PATENT DOCUMENTS

| | | | |
|---|---|---|---|
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,367,488 A | 11/1994 | An | |
| 5,379,257 A | 1/1995 | Matsumura et al. | |
| 5,386,379 A | 1/1995 | Ali-Yahia et al. | |
| 5,398,213 A | 3/1995 | Yeon et al. | |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A * | 9/2000 | Morgan ................... | G11C 7/06 365/149 |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujin et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,449,210 B1 * | 9/2002 | Manning ................ | G11O 5/025 365/230.03 |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,692,466 B2 | 4/2010 | Ahmadi | |
| 7,685,365 B2 | 5/2010 | Rajwar et al. | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mokhlesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Sec | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |

(56) References Cited

U.S. PATENT DOCUMENTS

| | | | |
|---|---|---|---|
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Penner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0178053 A1 | 7/2008 | Gorman et al. |
| 2008/0215937 A1 | 9/2008 | Dreibelbis et al. |
| 2008/0165601 A1 | 12/2008 | Matick et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0194367 A1* | 8/2011 | Wong ............... G11C 7/02 365/200 |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Sec |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0234707 A1* | 8/2015 | Vogelsang ............. G11C 29/44 714/764 |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |

(56) References Cited

U.S. PATENT DOCUMENTS

| | | |
|---|---|---|
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: hftp://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Acoustics, Speech, and Signal Processing.

"4.9.3 Minloc and Maxloc", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

\* cited by examiner

US 10,388,360 B2

UTILIZATION OF DATA STORED IN AN EDGE SECTION OF AN ARRAY

TECHNICAL FIELD

The present disclosure relates generally to semiconductor memory and methods, and more particularly, to apparatuses and methods for utilization of data stored in an edge section of an array of memory cells.

BACKGROUND

Memory devices are typically provided as internal, semiconductor, integrated circuits in computers or other electronic systems. There are many different types of memory including volatile and non-volatile memory. Volatile memory can require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources, e.g., one or more processors, which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data, e.g., one or more operands. As used herein, an operation can be, for example, a Boolean operation, such as AND, OR, NOT, NOT, NAND, NOR, and XOR, and/or other operations, e.g., invert, shift, arithmetic, statistics, among many other possible operations. For example, functional unit circuitry may be used to perform the arithmetic operations, such as addition, subtraction, multiplication, and division on operands, via a number of logical operations.

A number of components in an electronic system may be involved in providing instructions to the functional unit circuitry for execution. The instructions may be executed, for instance, by a processing resource such as a controller and host processor. Data, e.g., the operands on which the instructions will be executed, may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources, e.g., processor and associated functional unit circuitry, may be external to the memory array, and data is accessed via a bus between the processing resources and the memory array to execute a set of instructions. Processing performance may be improved in a processing in memory device, in which a processor may be implemented internally and near to a memory, e.g., directly on a same chip as the memory array.

A processing in memory device may save time by reducing and eliminating external communications and may also conserve power. However, the potential for other functions, such as read and write operations, being performed in addition to processing operations may influence the data processing time of the processing in memory device.

DETAILED DESCRIPTION

Figure 1:
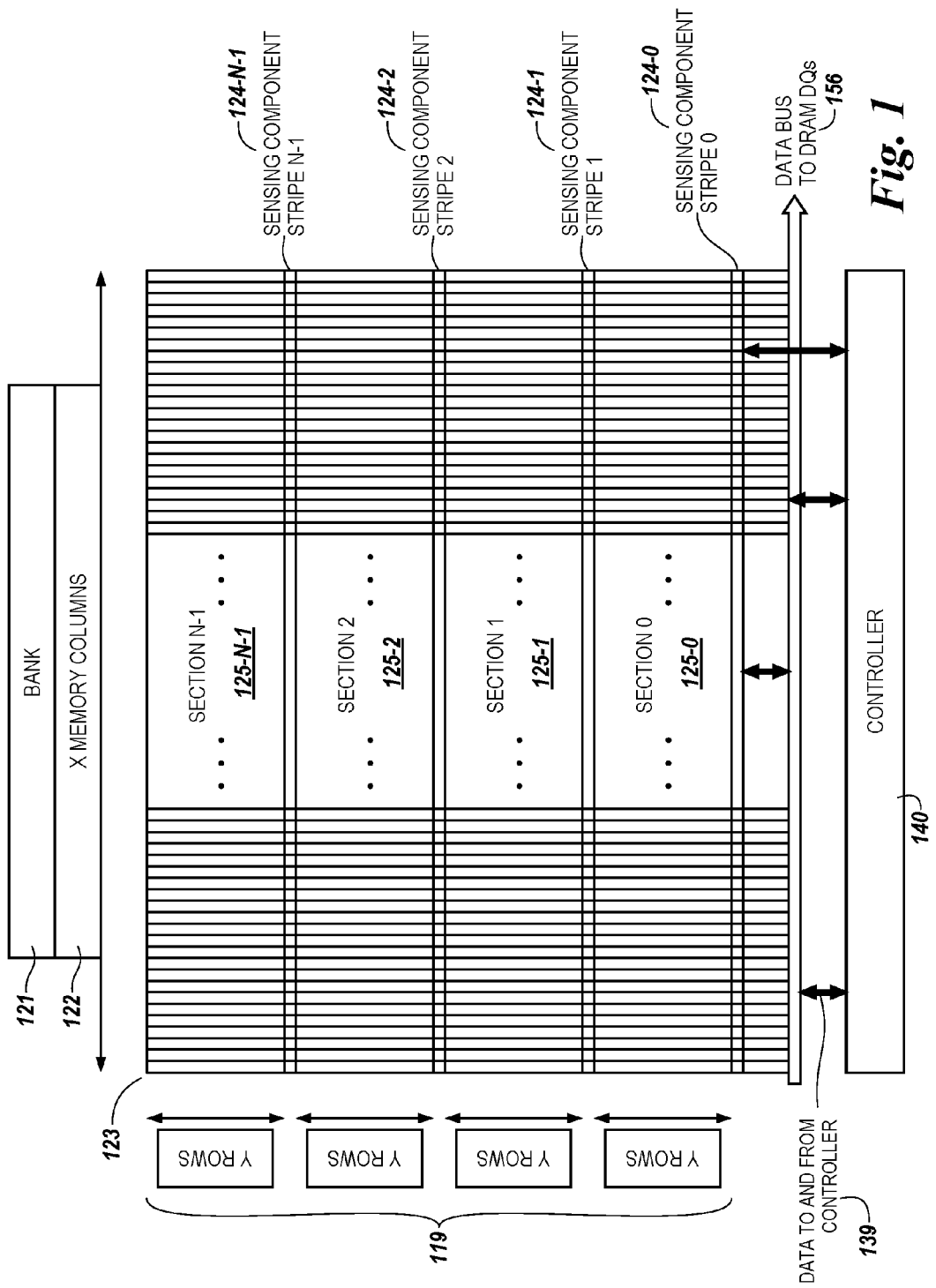
FIG. 1 is a block diagram of a plurality of sections of a bank of a memory device in a computing system in accordance with a number of embodiments of the present disclosure.

The present disclosure includes apparatuses and methods for utilization of data stored in an edge section of an array of memory cells. As described herein, a memory device may be utilized that has a one transistor, one capacitor (1T1C) memory cell configuration, e.g., in a DRAM array, among other types of memory. In previous embodiments, memory cells of a last section of an array of memory cells configured as a plurality of sections, e.g., subarrays, may not be utilized for data storage due to lack of a reference sense line for a 1T1C sense amplifier, as described further herein. Memory cells positioned within a section at an outside edge of the array of memory cells, beyond which there is not another section of the same array, may be defined to be positioned within an edge section of the array, e.g., within an edge array section, as used herein.

As such, an example apparatus described herein includes a memory device having first sensing circuitry positioned adjacent an edge of an edge array section and selectably coupled to a row memory cells. The first sensing circuitry includes a first sense amplifier, e.g., a two transistor, two capacitor (2T2C) sense amplifier, selectably coupled via a first sense line to a first memory cell in the row and via a second sense line to the first memory cell in the row. The example apparatus includes second sensing circuitry positioned at an opposite edge of the edge array section and selectably coupled to the row via a third sense line. The second sensing circuitry includes a second sense amplifier, e.g., a 1T1C sense amplifier, selectably coupled via the third sense line to a second memory cell in the row.

The example apparatus further includes a component positioned outside the edge array section and proximate, e.g., near, neighboring, adjacent, and/or contiguous, the first sensing circuitry, the component configured to perform an operation based on a type of data sensed by the first sensing circuitry. As described herein, the type of data corresponds to data including instructions to enable performance of a particular type of operation, e.g., code (bits) to enable error correction code (ECC) operations by ECC circuitry and/or microcode (bits) to enable performance of microcode-directed operations by a controller, among other types of data and operations.

In various embodiments, the first memory cell in the row, coupled via the first sense line and the second sense line to the first sense amplifier, can be a 2T2C memory cell and the second memory cell in the row coupled via the third sense line to the second sense amplifier can be a 1T1C memory cell. Ordinal numbers such as "first", "second", "third", etc., as used herein, are intended to differentiate types or uses of sensing circuitry, sense amplifiers, sense lines, memory cells, etc., and not an order in which they are positioned, unless explicitly stated otherwise. Among various embodiments, a component positioned outside the edge array section and proximate the first sensing circuitry may be ECC circuitry to which ECC, e.g., code, as described herein, stored by the 2T2C memory cells of the row and sensed by the first sense amplifier, e.g., the 2T2C sense amplifier, as described herein, of the edge array section may be moved via the first sense amplifier to enable performance of an ECC operation. Alternatively or in addition, a component positioned outside the edge array section may, in various embodiments, be a controller and/or a data line coupled to the controller, as described herein, to which microcode stored by the 2T2C memory cells of the row and sensed by the first sense amplifier of the edge array section may be moved via the first sense amplifier to enable performance of an operation by a microcode engine of the controller.

Figure 2A:
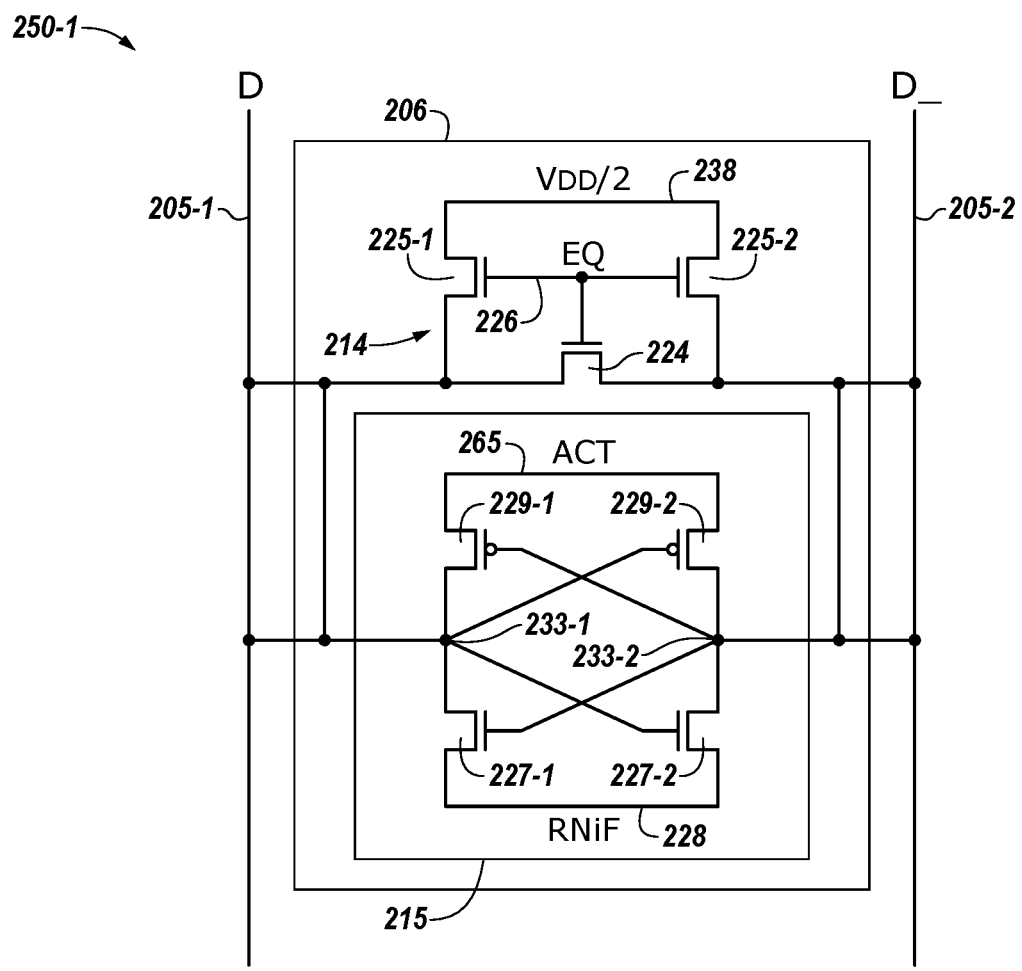
FIGS. 2A-2B are schematic diagrams illustrating sensing circuitry in accordance with a number of embodiments of the present disclosure.
Figure 2B:
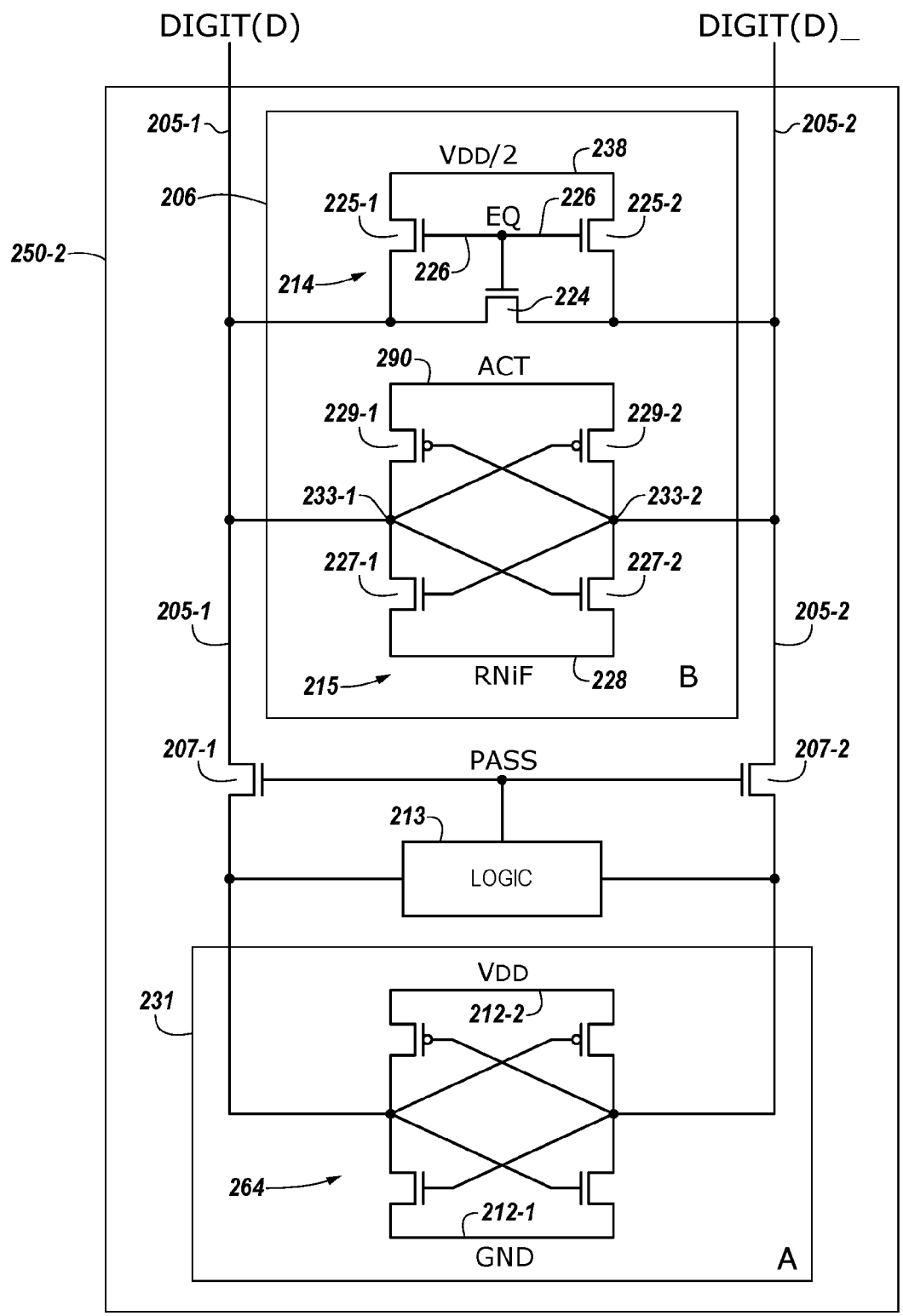

In some embodiments, the first sensing circuitry may also include a compute component, e.g., as described further in connection with FIG. 2B, coupled to the first sense amplifier, the first sense line, and the second sense line of the edge array section. As shown in and described in connection with FIG. 5A, the first sensing circuitry may be included in a first sensing component stripe, e.g., 524-0, physically associated with the edge array section 525-0 and the second sensing circuitry may be included in a second sensing component stripe, e.g., 524-1, physically associated with, e.g., between, the edge array section 525-0 and an adjacent array section 525-1.

As described in more detail below, the embodiments can allow a host system to allocate a number of locations, e.g., sections and/or portions of sections, in one or more DRAM banks to hold, e.g., store, and/or process data. A host system and a controller may perform the address resolution on an entire block of program instructions, e.g., command instructions, and data and direct, e.g., control, allocation, storage, and/or movement, e.g., flow, of data and commands into allocated locations, e.g., the sections and/or portions of sections, within a destination, e.g., target, bank. Executing some commands, for example, for performing DRAM write and/or read operations and/or for utilization of data stored in an edge section of an array of memory cells, as described herein, may utilize some of the normal DRAM signaling paths to the DRAM device.

In contrast, executing other commands may utilize signaling paths particular to utilization of the data stored in the edge section of an array of memory cells. For example, utilization of such data may be enabled by a number of transfer lines, e.g., as shown at reference numerals 662 in FIGS. 6A and 6B, that directly couple the first sense amplifiers of the first sensing circuitry, e.g., 2T2C sense amplifiers, of an edge array section to a component positioned adjacent the first sensing circuitry, or coupled directly to a data line directly coupled to a controller, for movement of instructions, e.g., ECC code and/or microcode, to the component to enable the performance of the operation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more", e.g., a number of sections of memory arrays, can refer to one or more of such sections, whereas a "plurality of" is intended to refer to more than one of such things. Furthermore, the words "can" and "may" are used throughout this application in a permissive sense, i.e., having the potential to, being able to, not in a mandatory sense, i.e., must. The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 140 may reference element "40" in FIG. 1, and a similar element may be referenced as 840 in FIG.

8. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

Figure 8:
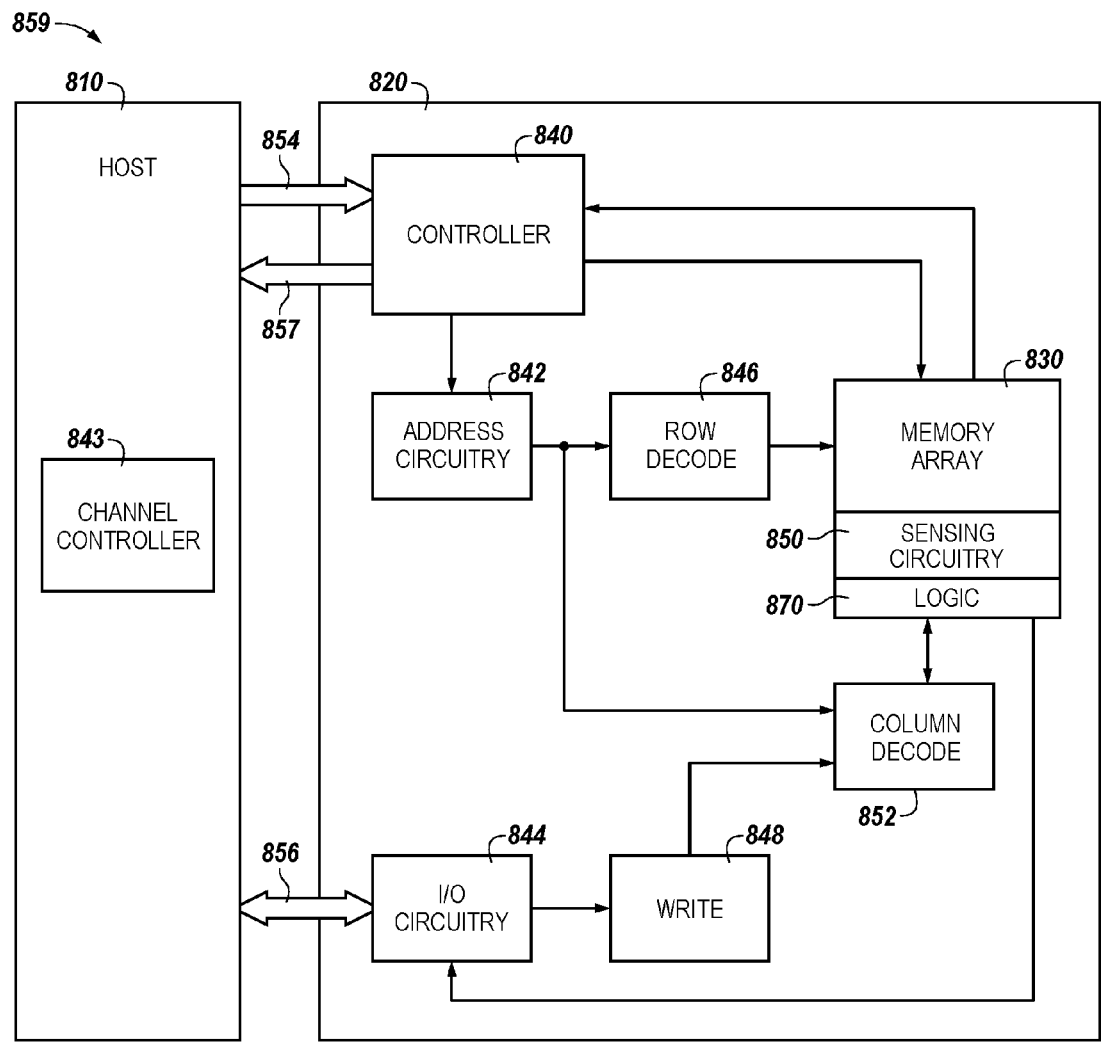
FIG. 8 is a block diagram of an apparatus in the form of a computing system including a memory device in accordance with a number of embodiments of the present disclosure.

FIG. 1 is a block diagram of a plurality of sections, e.g., sections 125-0, 125-1, . . . , 125-N-1, of a bank 121 of a memory device, e.g., as shown at 820 in FIG. 8, in a computing system in accordance with a number of embodiments of the present disclosure. By way of illustration, FIG. 1 shows a bank section 123 of the bank 121 of the memory device. For example, bank section 123 can represent an example bank section of a number of bank sections of the bank 121 of the memory device, e.g., bank section 0, bank section 1, . . . , bank section M-1 (not shown). As shown in FIG. 1, a bank section 123 can include a plurality of memory columns 122 shown horizontally as X, e.g., 4096, 8192, or 16,384 columns, among various possibilities, in an example DRAM bank and/or bank section. Additionally, the bank section 123 may be divided into section 0, section 1, . . . , and section N-1, e.g., 32, 64, or 128 sections, among various possibilities, shown at 125-0, 125-1, . . . , 125-N-1, respectively, that are separated by amplification regions configured to be coupled to a data path. As such, the sections 125-0, 125-1, . . . 125-N-1 can each have amplification regions 124-0, 124-1, . . . , 124-N-1 that correspond to sensing component stripe 0, sensing component stripe 1, . . . , and sensing component stripe N-1, respectively.

Each column 122, e.g., single or each pair of sense or digit lines, is configured to be coupled to sensing circuitry, as described in connection with sensing circuitry 850 in FIG. 8 and in more detail in connection with FIGS. 2A-2B and FIG. 3. As such, each column 122 in a section 125 can be coupled individually to a sense amplifier that contributes to a sensing component stripe 124 for that section. For example, as shown in FIG. 1, the bank section 123 can include sensing component stripe 0, sensing component stripe 1, . . . , sensing component stripe N-1 that each have sensing circuitry with sense amplifiers that can, in various embodiments, be used as registers, cache and/or data buffering and that are coupled to each column 122 in the sections 125-0, 125-1, . . . , 125-N-1.

Each of the of the sections 125-0, 125-1, . . . , 125-N-1 can include a plurality of rows 119 shown vertically as Y, e.g., each section may include 256, 512, 1024 rows, among various possibilities, in an example DRAM bank. Embodiments are not limited to the example horizontal and vertical orientation of columns and rows described herein or the example numbers thereof. Each of the plurality of rows 419 can include a single memory cell selectably coupled to each sense line, e.g., as shown and described in connection with a 1T1C configuration in FIGS. 4A-4C, and/or pairs of complementary memory cells, e.g., as shown in and described in connection with a 2T2C configuration in FIG. 3 and FIGS. 5A-5B. Each of the complementary memory cells of the pair can be coupled to one of a respective pair of sense lines at a position of the sense lines on the row. As such, the number of memory cells in a row can correspond to the number of sense lines that intersect that row.

For example, in a section with all memory cells in a 1T1C configuration, e.g., as shown and described in connection with sections 425-0, 425-1, and 425-2 in FIG. 4 and sections 525-1 and 525-2 in FIG. 5, the number of 1T1C memory cells 418 and 518 in a row, e.g., rows 419 and 519, may correspond to the number of sense lines 405 and 505 and columns 122, which also may correspond to the number of 1T1C sense amplifiers 417 and 517. In contrast, in a section with some memory cells in a 2T2C configuration, e.g., as shown and described in connection with section 525-0 in FIG. 5, the number of 2T2C memory cells 521 in the row 519-0 also may correspond to the number of sense lines, which may be double the number of pairs of sense lines, e.g., 505-1 and 505-3, the number of columns 122, and/or the number of 2T2C sense amplifiers 506, as described herein.

For example, there may be 8192, 16,384, or 32,768 individual memory cells in 4096, 8192, or 16,384 complementary pairs, each complementary pair forming a 2T2C memory cell, in a row that intersects 4096, 8192, or 16,384 columns and/or in which the 2T2C memory cells are each selectably coupled to 4096, 8192, or 16,384 2T2C sense amplifiers, among various possibilities, in an example DRAM bank and section. Accordingly, example edge array section 525-0 shown in FIG. 5A may include a sensing component stripe 524-1 along a top edge of the section that includes 8,192 1T1C sense amplifiers 517 and a sensing component stripe 524-0 along a bottom edge of the edge array section that includes 4,096 2T2C sense amplifiers 506. As such, there may be 8,192 1T1C memory cells 518 and 4,096 2T2C memory cells 521 per row 519-0, for a total of 12,288 1T1C and 2T2C memory cells per row in the edge array section 525-0. By comparison, the array section 525-1 adjacent the edge array section 525-0, e.g., "adjacent array section", positioned medial in the array relative to one of two edge array sections positioned at the two ends, e.g., edges, of the array may have 2×8,192=16,384 1T1C memory cells per row. The 16,384 1T1C memory cells may be selectably coupled to the combination of the 2×8,192=16, 384 1T1C total sense amplifiers 517 in sensing component stripes 524-1 and 524-2.

As shown in FIG. 1, portions of the sensing circuitry, e.g., sense amplifiers, compute components, etc., can be separated between a number of sensing component stripes 124 that are each physically associated with a section of memory cells 125 in the bank section 123. The sense amplifiers may sense data values stored by memory cells of the sections and/or the sense amplifiers may sense residual voltages on the sense lines as a reference voltage for determination of a sensed data value.

For example, as shown and described in connection with FIGS. 4A and 5A, a 1T1C sense amplifier, e.g., 417-1-0 and 517-1-0, in a sensing component stripe, e.g., 424-1 and 524-1, respectively, may sense a data value stored by a 1T1C memory cell in a row, e.g., 419-0 and 519-0, via a portion of a sense line, e.g., 405-1-0 and 505-1-0, extending into edge array section 425-0 or 525-0 and coupled to the 1T1C memory cell, e.g., 418-0-0 and 518-0-0 (not shown). The same 1T1C sense amplifier uses a complementary portion of the sense line, e.g., 405-1-0 and 505-1-0, extending into the adjacent array section 425-1 or 525-1, and which is not coupled to any 1T1C memory cell, to sense a reference voltage in the complementary portion of the sense line. The reference voltage in the complementary portion of the sense line, e.g., 405-1-0 and 505-1-0, enables determination of a relative voltage level on the portion of the sense line coupled to the 1T1C memory cell. Alternatively, the data value may be sensed by the 1T1C sense amplifier, e.g., 417-0 and 517-0, in a memory cell, e.g., in row 419-1, of the adjacent array section while using the reference voltage sensed in the complementary portion of the sense line extending into the edge array section.

By comparison, as shown and described in connection with FIG. 5A, a 2T2C sense amplifier, e.g., 506-0, in a sensing component stripe, e.g., 524-0, may sense a data value stored by a 2T2C memory cell in a row, e.g., 519-0, via sense lines, e.g., 505-0-1 and 505-0-2, extending into edge array section 525-0 and coupled to the 2T2C memory cell, e.g., complementary memory cells 521-0-1 and 521-0-2, as shown and described in connection with FIG. 5B. In some embodiments, the 2T2C memory cell may be a combination of 1T1C memory cells, e.g., as shown at 418-0-1 and 418-0-2 and described in connection with FIG. 4B.

The sense lines, e.g., 505-0-1 and 505-0-2, in the 2T2C configuration both contain memory cell data, e.g., a voltage applied to each sense line, such that neither has a reference voltage at the time of sensing. In the 2T2C configuration, the same 2T2C sense amplifier, e.g., 506-0, can have sense amplifier inputs connected to both sense lines, e.g., 505-0-1 and 505-0-2. A difference from the 1T1C configuration is that both sense lines connected to the 2T2C sense amplifier have a memory cell voltage applied to them after initially being equilibrated to a reference voltage, e.g., $V_{DD}/2$, via the sense lines. For example, a row line, e.g., access lines 304-X, 304-Y shown in and described in connection with FIG. 3, may access a separate 1T1C memory cell of the 2T2C memory cell, e.g., 521-0-1 and 521-0-2, for each sense line. One of these 1T1C memory cells can have a low voltage and the other 1T1C memory cell can have a relatively high voltage. This relative voltage difference results in a voltage difference, e.g., amplitude, between the two sense amplifier inputs in the 2T2C configuration that may be, for example, two times an amplitude of the voltage difference in some 1T1C configurations.

The relatively high voltage on an access line, e.g., 505-0-1, may be increased while the relatively low voltage on a complementary access line, e.g., 505-0-2, may be decreased, or vice versa. For example, the 2T2C sense amplifier, e.g., 506-0, may amplify the sensed data value voltages to full rail voltages for conversion of the sensed voltages from the pair of complementary memory cells, sensed via the complementary access lines, to a data value, e.g., a binary 0 or 1 data value, by determination of the voltage differential, e.g., for a read operation, among other possible operations.

In some embodiments, the sense amplifiers, e.g., either the 1T1C or the 2T2C sense amplifiers, may at least temporarily store, e.g., cache, sensed data values. The compute components described herein in connection with the 2T2C sense amplifiers may, in some embodiments, perform compute operations on the cached data values in the plurality of sensing component stripes 124. Sensing of the data value voltages and the reference voltages on sense lines for complementary memory cells in the same section and amplification of the voltage differential thereof to determine the corresponding data values for 2T2C memory cells may result in improved reliability of, e.g., fewer read errors in, such read operations relative to read operations performed in a 1T1C memory configuration.

As shown in FIG. 1, the bank section 123 can be associated with controller 140. The controller 140 shown in FIG. 1 can, in various embodiments, represent at least a portion of the functionality embodied by and contained in the controller 840 shown in and described in connection with FIG. 8. The controller 140 can direct, e.g., control, input of commands and data 139 to the bank section 123 and/or output, e.g., movement, of data from the bank section 123.

For example, the controller 140 can control and/or direct movement of data and/or instructions, as described herein, directly from, e.g., via the number of transfer lines 662 shown in FIGS. 6A and 6B, the first sense amplifiers of the first sensing circuitry, e.g., 2T2C sense amplifiers, of sensing component stripe 124-0 of edge array section 125-0 to a component positioned adjacent the first sensing circuitry, e.g., ECC circuitry 659 as shown in and described in connection with FIG. 6A. Alternatively or in addition, the transfer lines 662 may be utilized for movement of data and/or instructions from the first sense amplifiers of the first sensing circuitry of sensing component stripe 124-0 of edge array section 125-0 to the controller 140 via data line 645, as shown in and described in connection with FIG. 6B, directly coupled to the controller and/or to a data bus, as described below.

The bank section 123 can include a data bus, e.g., a 64 bit wide data bus, to DRAM DQs, which can correspond to the data bus 156, 656, and/or 856 shown and described in connection with FIGS. 1, 6A-6B, and/or 8, respectively. Each data bus for each bank of sections, e.g., 125-0, 125-1, ..., 125-N–1, can be referred to as a portion of a data bus that contributes to formation of a combined data bus, e.g., for a plurality of banks and/or memory devices. As such, in some embodiments, eight 64 bit wide data bus portions for eight banks can contribute to a 512 bit wide combined data bus. Alternatively or in addition, each bank can individually use the entirety of the 512 bit wide combined data bus, although one bank at a time. Various combinations of using the data bus portions also may be utilized. For example, one bank may use four data bus portions at the same time as four other banks each use one of the remaining four data bus portions, among other possibilities.

In order to appreciate the performance of operations described herein, a discussion of an apparatus for implementing such techniques follows. For example, such an apparatus may be a memory device having a controller, e.g., as shown at 140, 640, and/or 840 and described in connection with FIGS. 1, 6B, and/or 8, that is on chip with a memory array and/or sensing circuitry thereof, e.g., as shown at 830 and 850, respectively, and described in connection with FIG. 8 and/or having a capability for bit vector operations, e.g., PIM capabilities, and an associated host. However, embodiments described herein are not limited to memory devices having PIM capabilities.

As such, in some embodiments, program instructions, e.g., PIM commands, involving a memory device having PIM capabilities can distribute implementation of the PIM commands and data over multiple sensing circuitries that can implement operations and can move and store the PIM commands and data within the memory array, e.g., without having to transfer such back and forth over an A/C and data bus between a host and the memory device. Thus, data for a memory device having PIM capabilities can be accessed and used in less time and/or using less power. For example, a time and power advantage can be realized by increasing the speed, rate, and/or efficiency of data being moved around and stored in a computing system in order to process requested memory array operations. Such operations may include compute operations, such as reads and/or writes, etc., as DRAM operations and/or PIM logical operations, such as logical Boolean operations, data movement operations, etc., among others described herein.

FIG. 2A is a schematic diagram illustrating sensing circuitry 250-1 in accordance with a number of embodiments of the present disclosure. FIG. 2A shows a sense amplifier 206 coupled to a respective pair of complementary sense lines 205-1 and 205-2. The sense amplifier 206 shown in FIG. 2A can correspond to a plurality of sense amplifiers in the sensing circuitry associated with the plurality of sensing component stripes 124 shown in FIG. 1, for example, and/or in the sensing circuitry 850 shown in FIG. 8.

As shown and described in connection with FIG. 3, complementary memory cells are coupled to pairs of complementary sense lines 205-1 and 205-2, e.g., as columns, shown in FIG. 2A. For example, a memory cell can comprise a transistor and a capacitor. The memory cells can be, for example, 1T1C DRAM cells each comprising a storage element, e.g., a capacitor, and an access device, e.g., a transistor, although other configurations can be used, e.g., 2T2C with two transistors and two capacitors per memory cell. In a number of embodiments, the memory cells may be destructive read memory cells, e.g., reading the data stored in the cell destroys the data such that the data originally stored in the cell may be refreshed after being read. The cells of the memory array can be arranged in rows coupled by access lines and columns coupled by a single sense line extending into each of the adjacent sections in a 1T1C configuration, as show in and described in connection with FIGS. 4A-4C or coupled by pairs of complementary sense lines in a 2T2C configuration, for example, DIGIT(n−1)/ DIGIT(n−1)_, DIGIT(n)/DIGIT(n)_, DIGIT(n+1)/DIGIT(n+1)_, as shown at 205-1 and 205-2 in FIG. 2A and elsewhere herein. The individual sense lines corresponding to each pair of complementary data lines can also be referred to as sense lines 205-1 (D) and 205-2 (D_) respectively. Although only three pairs of complementary sense lines, e.g., three columns, are shown in FIG. 3, embodiments of the present disclosure are not so limited. For example, an array of memory cells can include additional columns of memory cells and/or sense lines, e.g., 4,096, 8,192, 16,384, etc.

Memory cells can be coupled to different sense lines and/or access lines. For example, a first source/drain region of an access transistor of a memory cell can be coupled to a sense line 205-1 (D), a second source/drain region of the access transistor of the memory cell can be coupled to a capacitor of the memory cell, and a gate of the access transistor of the memory cell can be coupled to an access line of the memory array.

As shown in FIG. 2A, the sensing circuitry 250-1 can comprise a sense amplifier 206 corresponding to a respective column of memory cells, e.g., coupled to respective pairs of complementary sense lines. The sense amplifier 206 can comprise, for example, a cross coupled latch, which can be referred to herein as a primary latch. A data storage state can include the sense amplifiers 206 storing a data value. As used herein, a data value can be referred to as a bit, e.g., an abbreviation of "binary digit".

In a number of examples, the sense amplifier 206 (or a compute component 231 as shown in and described in connection with FIG. 2B) can be in at least one of two states associated with the first mode and the second mode. As used herein, a state of a sense amplifier 206 can describe a transfer of data to or from the sense amplifier 206. The state of the sense amplifier 206 can also be described as whether the sense amplifier 206 is in an equilibration state or is storing a data value, e.g., a binary 0 or 1 data value. For example, a sense amplifier can be configured to be in an initial state, wherein the initial state is one of an equilibration state and a data storage state.

According to various embodiments, a sense amplifier 206 can comprise a cross coupled latch. However, embodiments of the sense amplifier 206 are not limited to a cross coupled latch. For example, the sense amplifier 206 in FIG. 2A can be current-mode sense amplifier and/or single-ended sense amplifier, e.g., sense amplifier coupled to one data line. Embodiments of the present disclosure also are not limited to a folded data line architecture.

In a number of embodiments, a sense amplifier 206 can comprise a number of transistors formed on pitch with the transistors of a corresponding compute component, e.g., compute component 231 shown and described in connection with FIG. 2B, and/or the memory cells of an array, e.g., memory array 830 shown in FIG. 8 and/or memory cells 302/303 shown in FIG. 3, to which they are coupled, which may conform to a particular feature size, e.g., $4F^2$, $6F^2$, etc. Sense amplifier 206 comprises a latch 215 including four transistors coupled to a pair of complementary sense lines D 205-1 and D_ 205-2. The latch 215 can be a cross coupled latch. For example, the gates of a pair of transistors, such as n-channel transistors 227-1 and 227-2, e.g., NMOS transistors, can be cross coupled with the gates of another pair of transistors, such as p-channel transistors 229-1 and 229-2, e.g., PMOS transistors. As described further herein, the latch 215 comprising transistors 227-1, 227-2, 229-1, and 229-2 can be referred to as a primary latch. However, embodiments are not limited to this example.

The voltages and/or currents on the respective sense lines 205-1 and 205-2 can be provided to the respective latch inputs 233-1 and 233-2 of the cross coupled latch 215, e.g., the input of the primary latch. In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1.

In this example, a second source/drain region of transistors 227-1 and 227-2 can be commonly coupled to a negative control signal (RNiF) 228. A second source/drain region of transistors 229-1 and 229-2 can be commonly coupled to an active positive control signal (ACT) 265. The ACT signal 265 can be a supply voltage, e.g., $V_{DD}$, and the RNiF signal can be a reference voltage, e.g., ground. RNiF signal 228 and ACT signal 265 can function as activating signals that enable the cross coupled latch 215.

The enabled cross coupled latch 215 can operate to amplify a differential voltage between latch input 233-1, e.g., first common node, and latch input 233-2, e.g., second common node, such that latch input 233-1 is driven to one of the ACT signal voltage and the RNiF signal voltage, e.g., to one of $V_{DD}$ and ground, and latch input 233-2 is driven to the other of the ACT signal voltage and the RNiF signal voltage. The ACT signal voltage and the RNiF signal voltage may correspond to the full rail voltages for conversion of the sensed voltages from the pair of complementary memory cells to a data value, e.g., a binary 0 or 1 data value, by determination of the voltage differential for a read operation, among other possible operations.

The sense amplifier 206 may also include equilibrate circuitry 214 configured to equilibrate sense line 205-1 and sense line 205-2 in association with, for example, preparing the sense amplifier for a logical operation. In this example, the equilibrate circuitry 214 comprises a transistor 224 having a first source/drain region coupled to a first source/drain region of transistor 225-1 and sense line 205-1. A second source/drain region of transistor 224 can be coupled to a first source/drain region of transistor 225-2 and sense line 205-2. A gate of transistor 224 can be coupled to gates of transistors 225-1 and 225-2.

The second source drain regions of transistors 225-1 and 225-2 can be coupled to an equilibration voltage 238, which can be equal to $V_{DD}/2$, where $V_{DD}$ is a supply voltage associated with the array. The gates of transistors 224, 225-1, and 225-2 can be coupled to control signal 226 (EQ).

As such, activating EQ can enable the transistors 224, 225-1, and 225-2, which can effectively short sense line 205-1 to sense line 205-2. Shorting the sense lines as such may substantially equilibrate the sense lines 205-1 and 205-2 to the equilibration voltage $V_{DD}/2$. As described herein, the sense amplifier 206 may be enabled, e.g., fired, to sense and/or store voltage potentials from two complementary memory cells coupled to adjacent sense lines 205-1 and 205-2, which may be on both sides of the sense amplifier 206.

FIG. 2B is another schematic diagram illustrating sensing circuitry 250-2 in accordance with a number of embodiments of the present disclosure. FIG. 2B indicates that a number of sense amplifiers 206 can be coupled to respective pairs of complementary sense lines 205-1 and 205-2, and a corresponding number of compute components 231 can be coupled to the sense amplifiers 206 via pass gates 207-1 and 207-2. The sense amplifier 206 and compute component 231 shown in FIG. 2B can correspond to the sensing circuitry associated with the plurality of sensing component stripes 124 shown in FIG. 1, for example, and/or to sensing circuitry 850 shown in FIG. 8. The sensing circuitry 250-2 shown in FIG. 2B includes logical operation selection logic 213, which can be operated as described further below.

As shown in FIG. 2B, the sensing circuitry 250-2 can comprise a sense amplifier 206, a compute component 231, and logical operation selection logic 213 corresponding to a respective column of memory cells, e.g., coupled to respective pairs of complementary sense lines. The sense amplifiers 206 can be configured, for example, as described with respect to FIG. 2A. The sensing circuitry 250-2 can be operated in both a pre-sensing mode, e.g., sense amplifiers 206 fired before logical operation control signal active, and post-sensing mode, e.g., sense amplifiers 206 fired after logical operation control signal active, with a result of a logical operation performed by the compute component 231 being initially stored in the sense amplifier 206.

As shown in FIG. 2B, the compute component 231 can comprise a latch, which can be referred to herein as a secondary latch 264. The secondary latch 264 can be configured and operated in a manner similar to that described above with respect to the primary latch 215. In some embodiments, a pair of cross coupled p-channel transistors, e.g., PMOS transistors, included in the secondary latch can have their respective sources coupled to a supply voltage 212-2, e.g., $V_{DD}$, and the pair of cross coupled n-channel transistors, e.g., NMOS transistors, of the secondary latch can have their respective sources selectively coupled to a reference voltage 212-1, e.g., ground, such that the secondary latch 264 may be continuously enabled. In a number of embodiments, the secondary latch 264 of the compute component 231 can serve as an accumulator. As such, the compute component 231 can operate as and/or may be referred to herein as an accumulator. The configuration of the compute component 231 is not limited to that shown in FIG. 2B, and various other embodiments are feasible within the scope of the present disclosure.

The gates of the pass gates 207-1 and 207-2 can be controlled by a logical operation selection logic signal, Pass. For example, an output of the logical operation selection logic 213 can be coupled to the gates of the pass gates 207-1 and 207-2.

Data values present on the pair of complementary sense lines 205-1 and 205-2 can be loaded into the compute component 231 via the pass gates 207-1 and 207-2. When the pass gates 207-1 and 207-2 are OPEN, data values on the pair of complementary sense lines 205-1 and 205-2 may be passed to the compute component 231. The data value on the pair of complementary sense lines 205-1 and 205-2 can be the data value stored at least temporarily in the sense amplifier 206 when the sense amplifier is enabled, e.g., fired. The logical operation selection logic signal, Pass, is activated to OPEN, e.g., turn on, the pass gates 207-1 and 207-2.

The control signals can operate to select a logical operation to implement based on the data value ("B") in the sense amplifier 206 and the data value ("A") in the compute component 231, e.g., as used herein, the data value stored in a primary latch of a sense amplifier is referred to as a "B" data value, and the data value stored in a secondary latch of a compute component is referred to as an "A" data value. In particular, the control signals may be configured to select the logical operation, e.g., function, to implement independent from the data value present on the pair of complementary sense lines 205-1 and 205-2, although the result of the implemented logical operation can be dependent on the data value present on the pair of complementary sense lines 205-1 and 205-2.

Although not shown in FIG. 2B, each column of memory cells can be coupled to a column decode line that can be activated to transfer, via a local input/output (I/O) line, a data value from a corresponding sense amplifier 206 and/or compute component 231 to a control component external to the array such as an external processing resource, e.g., host processor and/or other functional unit circuitry. The column decode line can be coupled to a column decoder, e.g., column decoder 852 in FIG. 8. However, as described herein, data need not be transferred via such I/O lines to perform logical operations. For example, circuitry can be operated in conjunction with sense amplifiers 206 and compute components 231 to perform logical operations without transferring data to a control component external to the array. As used herein, transferring data can include, for example, moving data from a source location to a destination location without necessarily maintaining a copy of the data at the source location.

In operation, a data value on a pair of complementary sense lines, e.g., 205-1/205-2, can be loaded into a corresponding compute component 231, e.g., by operating logical operation selection logic as described above. For example, a data value can be loaded into a compute component 231 via overwriting of the data value currently stored in the compute component 231 with the data value stored in the corresponding sense amplifier 206.

The sensing circuitry 250-2 in FIG. 2B can be operated in several modes to perform logical, e.g., bit vector and/or PIM, operations, including a first mode in which a result of the logical operation is initially stored in the sense amplifier 206, and a second mode in which a result of the logical operation is initially stored in the compute component 231. For example, if the sense amplifier 206 is equilibrated and the control signals are activated to provide a conduction path, e.g., electrical continuity, between the sense amplifier 206 and the compute component 231, then a data value stored in the compute component 231 can be transferred from the compute component 231 to the sense amplifier 206. If the sense amplifier 206 is configured to store a first bit, e.g., first data value, and the control signals are activated to provide a conduction path between the sense amplifier 206 and the compute component 231, then a second bit, e.g., second data value, that is stored in the compute component 231 before the activation of the control signals can be replaced by the first bit and the sense amplifier 206 retains the first bit. Furthermore, a number of bit vector and/or PIM operations can be performed using the first bit and the second bit using the logical operation selection logic and the result of the operation can be stored in the compute component 231.

As described herein, the sense amplifier 206 can, in some embodiments in conjunction with the compute component 231, be operated to perform various logical operations, e.g., using data and/or residual voltages from an array as input. In a number of embodiments, the result of a logical operation can be stored back to the array without transferring the data via a data line address access, e.g., without firing a column decode signal such that data is transferred to circuitry external to the array and sensing circuitry via local I/O lines. As such, a number of embodiments of the present disclosure can enable performing various PIM operations, e.g., bit vector operations, logical operations, shift operations, mathematical operations, data movement operations using shared I/O lines, etc., using less power than various previous approaches. Additionally, because a number of embodiments can reduce or eliminate moving, e.g., copying, transferring, data across I/O lines in order to perform operations, e.g., between memory and a discrete processor, which may be off pitch, a number of embodiments may enable an increased parallel processing capability as compared to previous approaches.

Figure 3:
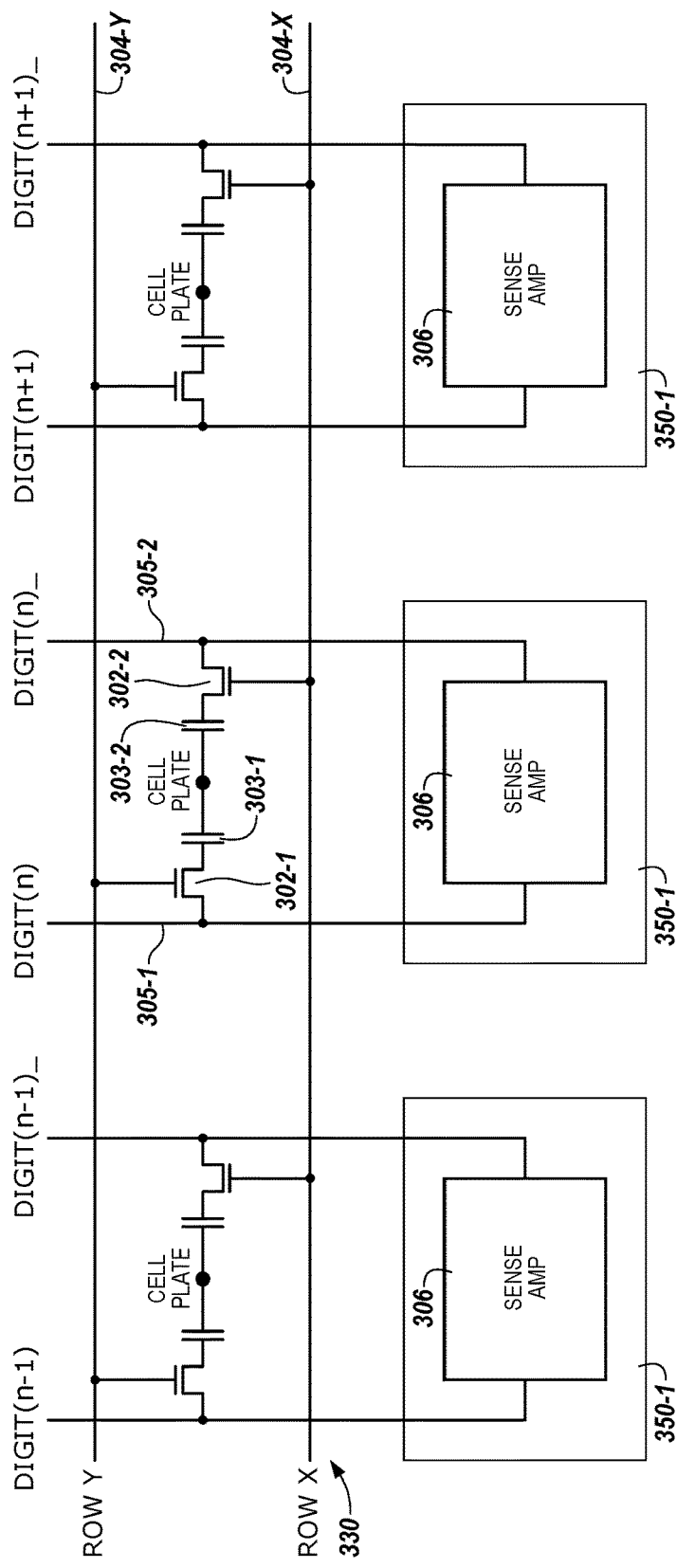
FIG. 3 is a schematic diagram of a memory device in accordance with a number of embodiments of the present disclosure.

FIG. 3 is a schematic diagram of a memory device in accordance with a number of embodiments of the present disclosure. In the embodiment illustrated in FIG. 3, the memory array 330 is an array, for example a DRAM array, of paired 1T1C memory cells that can each include an access device 302, e.g., a transistor, and a storage element 303, e.g., a capacitor, to form a 2T2C memory cell. The 2T2C memory cells of the memory array 330 can be arranged in rows, e.g., as shown at 119 and described in connection with FIG. 1, coupled by access lines 304-X (Row X), 304-Y (Row Y), etc., and columns coupled by pairs of complementary sense lines DIGIT(n−1)/DIGIT(n−1)_, DIGIT(n)/DIGIT(n)_, and DIGIT(n+1)/DIGIT(n+1)_, etc. The individual sense lines corresponding to each pair of complementary data lines can be referred to as sense lines 305-1 (DIGIT(n)) and 305-2 (DIGIT(n)_) respectively. Although only three pairs of complementary sense lines are shown in FIG. 3, embodiments of the present disclosure are not so limited, and an array of memory cells may include additional columns of memory cells and/or sense lines, e.g., 4,096, 8,192, 16,384, etc.

As shown in FIG. 3, a gate of a particular memory cell transistor 302 can be coupled to its corresponding access line 304-X, 304-Y, etc., a first source/drain region can be coupled to its corresponding data line, e.g., 305-1 (DIGIT (n), 305-2 (DIGIT(n)_), and a second source/drain region of a particular memory cell transistor can be coupled to its corresponding capacitor 303.

Memory cells can be coupled to different sense lines and/or access lines. For example, a first source/drain region of a transistor 302-1 can be coupled to sense line 305-1, a second source/drain region of transistor 302-1 can be coupled to capacitor 303-1, and a gate of a transistor 302-1 can be coupled to access line 304-Y. A first source/drain region of transistor 302-2 can be coupled to sense line 305-2, a second source/drain region of transistor 302-2 can be coupled to capacitor 303-2, and a gate of a transistor 302-2 can be coupled to access line 304-X. The cell plate, as shown in FIG. 3, can be coupled to each of capacitors 303-1 and 303-2. The cell plate can be a common node to which a reference voltage, e.g., ground, can be applied in various memory array configurations.

As described herein, the transistors 302 and capacitors 303 can contribute to formation of the pairs of complementary memory cells, e.g., 2T2C memory cells, in a single row of the memory array that are coupled to the complementary sense lines, e.g., sense lines 305-1 and 305-2. The number of data values, e.g., voltages, sensed from the memory cells in sense operations may correspond to the number of columns of memory cells and/or pairs of sense lines, e.g., 4,096, 8,192, 16,384, etc., that intersect a row, for example, of a section 125 shown in and described in connection with FIG. 1. In various embodiments, each section may include 256, 512, 1024 rows, among other possible numbers of rows, and each bank section may be divided into 32, 64, or 128 sections, among various possibilities.

The memory array 330 illustrated in FIG. 3 is coupled to sensing circuitry 350 in accordance with a number of embodiments of the present disclosure. In some embodiments, the sensing circuitry 350-1 may include a 2T2C sense amplifier 306 corresponding to respective columns of memory cells, e.g., coupled to respective pairs of complementary data lines 305-1, 305-2, but does not additionally include a compute component, e.g., 231 shown in FIG. 2B. However, embodiments are not so limited. For example, some embodiments of the sensing circuitry (not shown) may include a compute component that can perform compute and/or accumulator functionalities. The sensing circuitry 350 can correspond to sensing circuitry described in connection with the sensing component stripes 124 in FIG. 1, for example, and/or to sensing circuitry 850 shown in FIG. 8.

The sense amplifier 306 can correspond to sense amplifier 206 described previously with respect to FIGS. 2A-2B. The sense amplifier 306 can be operated to determine a data value stored in, e.g., a logic state, and/or a residual voltage at a selected memory cell, which may be represented by the voltages present on the complementary sense lines 305-1, 305-2.

Figure 4A:
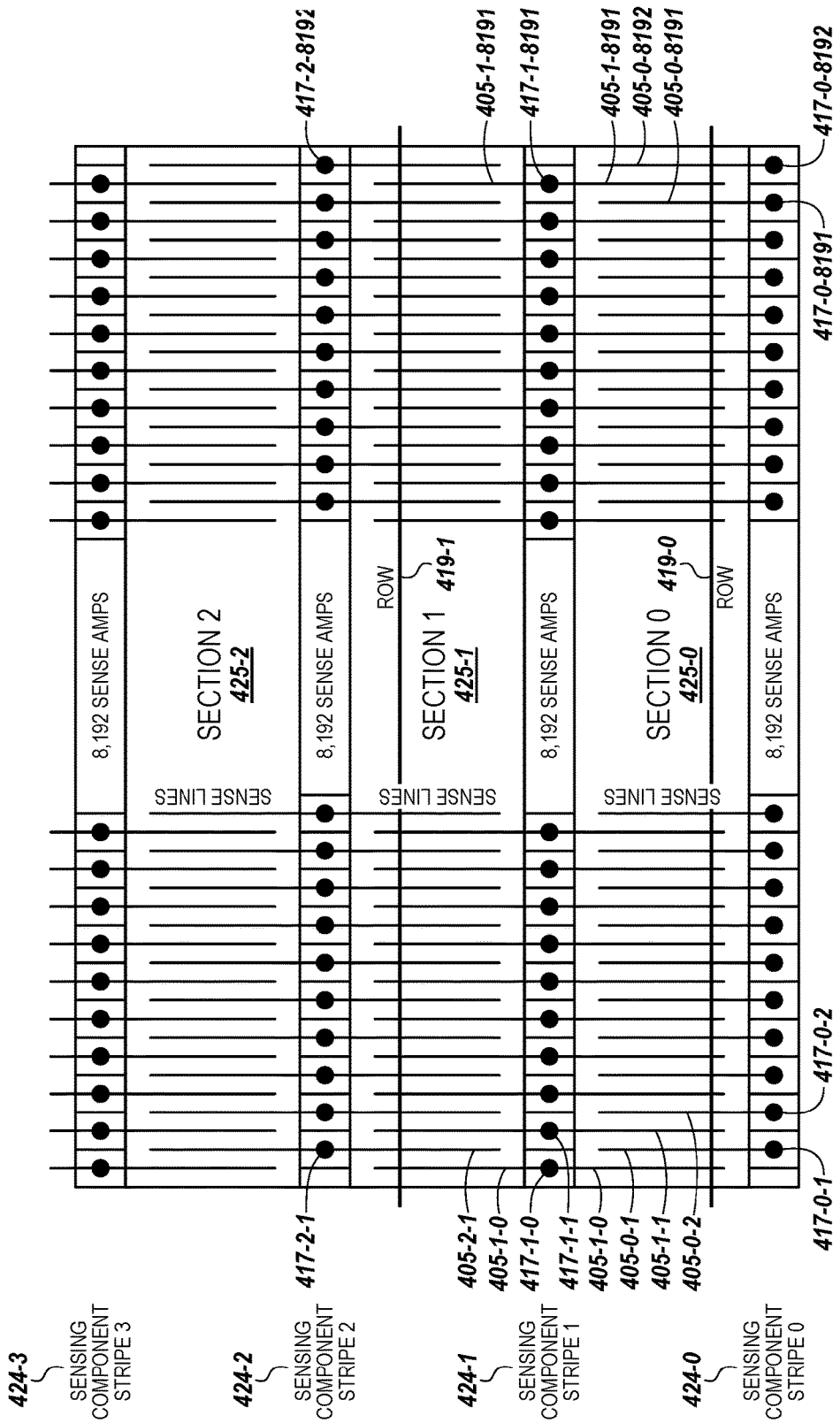
FIG. 4A is a block diagram of sections in a bank of a memory device in a one transistor, one capacitor (1T1C) configuration in accordance with a number of embodiments of the present disclosure.
Figure 4B:
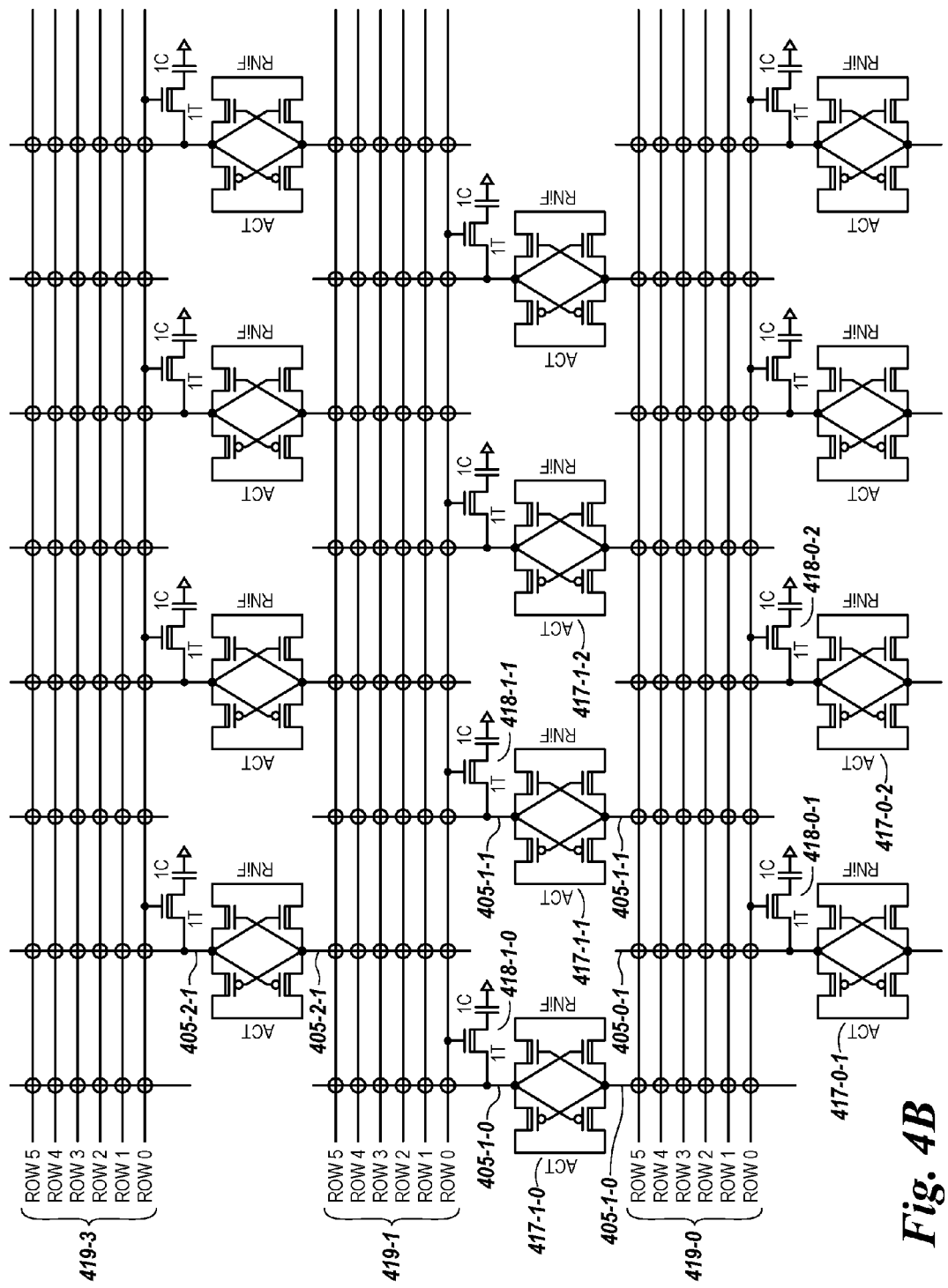
FIGS. 4B-4C are schematic diagrams illustrating an example of memory device circuitry in the 1T1C configuration in accordance with a number of embodiments of the present disclosure.

FIG. 4A is a block diagram of sections, e.g., section 0 at 425-0, section 1 at 425-1, section 2 at 425-2, etc., in a bank of a memory device in a 1T1C configuration in accordance with a number of embodiments of the present disclosure. FIG. 4A shows a 1T1C DRAM architecture, for example. When row 419-1 in section 425-1 is selected and opened, e.g., fired by execution of a fire row command, 8192 1T1C sense amplifiers, e.g., 417-1-0, 417-1-1, . . . , 417-1-8191, in sensing component stripe 1 at 424-1 and 8192 sense amplifiers, e.g., 417-2-1, 417-2-2, . . . , 417-2-8192, in sensing component stripe 2 at 424-2 may be enabled, e.g., fired, to sense and/or store voltage potentials from two portions of a sense line, e.g., 405-1 and 405-2, coupled to each of the sense amplifiers.

As shown in section 425-1, portions of sense lines coupled to sense amplifiers 417-1-0, 417-1-1, . . . , 417-1-8191 that intersect with row 419-1, e.g., sense lines 405-1-0, 405-1-1, . . . , 405-18191, extend upward through section 425-1 toward row 419-1, where the sense line may be selectably coupled to a particular 1T1C memory cell, e.g., as shown at 418-1-0, 418-1-1, . . . , etc., in row 419-1. A complementary portion of each of the sense lines, e.g., sense lines 405-1-0, 405-1-1, . . . , 405-18191 coupled to and extending downward from the sense amplifiers 417-1-0, 417-1-1, . . . , 417-1-8191 into section 425-0 may be used by the sense amplifier to sense a reference, e.g., residual, voltage on the sense line when the sense line is not coupled to a memory cell in section 425-0, e.g., the sense line is open. The residual voltage on the open sense line in section 425-0 may be used as a reference to determine a data value corresponding to the voltage sensed on the memory cells in row 419-1 of section 425-1. The sense amplifiers 417-2-1, 417-2-2, . . . , 417-2-8192 in sensing component stripe 424-2 may be similarly coupled to portions of sense lines in section 425-1 that intersect row 419-1 and portions of the sense lines that extend into section 425-2 to serve as references to determine the data values of the remaining memory cells in row 419-1. As such, the combination of 16,384 sense amplifiers in sensing component stripes 424-1 and 424-2 may sense and latch, e.g., store, data values from the 16,384 memory cells associated with row 419-1.

In some embodiments, half of the sense lines in section 425-1 may be coupled to sense amplifiers in sensing component stripe 424-1, while the other half of the sense lines in section 425-1 may be coupled to sense amplifiers in sensing component stripe 424-2, e.g., configured as interlaced sense lines. The reference sense lines for the sense amplifiers in sensing component stripe 424-1 are in section 425-0, while the reference sense lines for the sense amplifiers in sensing component stripe 424-2 are in section 425-2. Utilization of such neighboring, e.g., adjacent, sections for reference sense lines may continue throughout a memory array, e.g., DRAM architecture. However, this architecture may present an issue at the edge of such arrays because there is no adjacent section on an outside edge of the edge array section, e.g., as shown for edge array section 425-0 in FIGS. 4A-4C. Therefore, half of the sense lines for an edge array section, e.g., section 425-0, may not be configured and/or utilized in the same manner as the sense lines for the non-edge array section, e.g., as described previously for adjacent array section 425-1.

In some previous implementations, this lack of an adjacent array section, on an outside edge of the edge array section, usable for reference sense lines for the sense amplifiers may result in not utilizing half the various memory elements associated with that edge array section, e.g., section 425-0 as formed by an automated fabrication process. As shown in more detail in FIG. 4B, the memory elements associated with edge array section 425-0 that may not be utilized can, for example, include the number of 1T1C sense amplifiers, e.g., 417-0-1, 417-0-1, . . . , 417-0-8192, in sensing component stripe 424-0 and the number of 1T1C memory cells, e.g., 418-0-1, 418-0-2, . . . , 418-0-8192, in each row 419-0, e.g., rows 0-5 of edge array section 425-0, selectably coupled via the respective sense lines, e.g., 405-0-1, 405-0-2, . . . , 405-0-8192, to the respective 1T1C sense amplifiers.

Figure 4C:
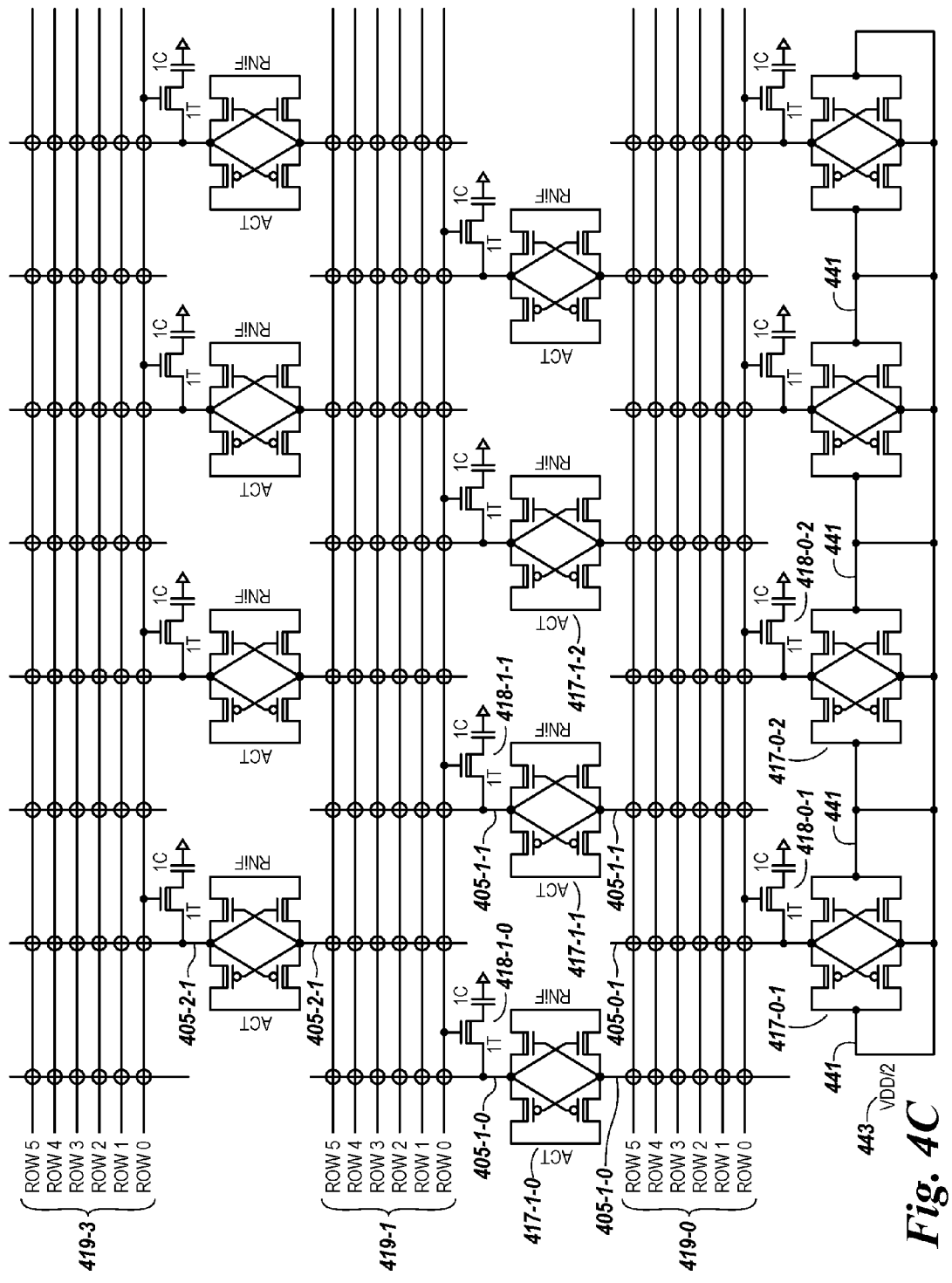

In various previous implementations, not utilizing the just described memory elements in the edge array section, e.g., 425-0, may be enabled even though the memory elements remain on the chip. For example, as shown in FIG. 4C, the 1T1C sense amplifiers 417-0 in sensing component stripe 424-0 may have interconnections 441 that disable utilization of the sense amplifiers, memory cells, and/or sense lines, etc. In various configurations, the interconnections 441 may be connected to ground and/or a DC voltage 443, e.g., $V_{DD}/2$, to contribute to disabling utilization of the sense amplifiers, memory cells, and/or sense lines, etc.

Figure 5A:
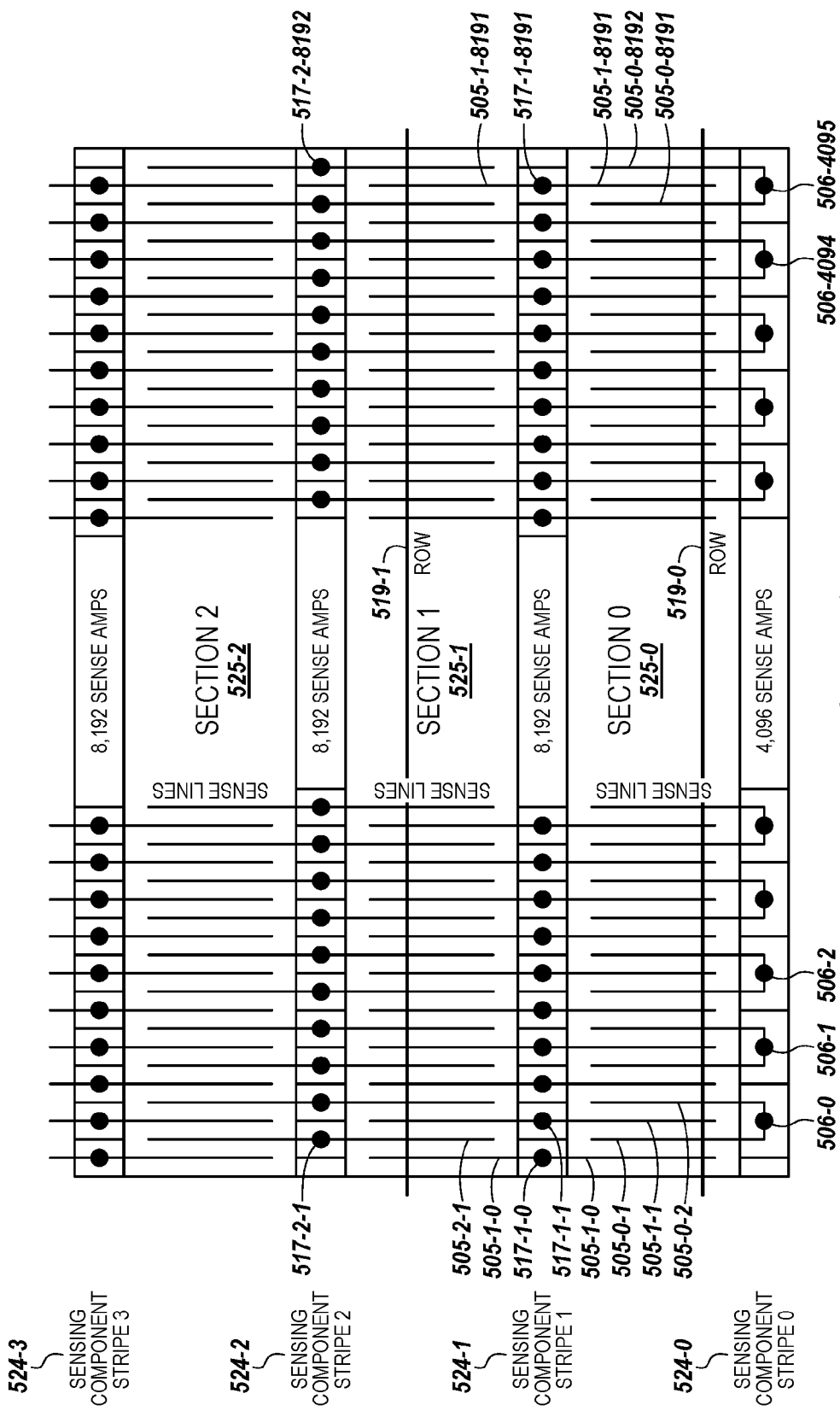
FIG. 5A is a block diagram of sections in a bank of a memory device with an edge array section in a combined 1T1C and two transistor, two capacitor (2T2C) configuration in accordance with a number of embodiments of the present disclosure.

FIG. 5A is a block diagram of sections in a bank of a memory device with an edge array section, e.g., 525-0, in a combined 1T1C and 2T2C configuration in accordance with a number of embodiments of the present disclosure. The non-edge array sections, e.g., sections 525-1, 525-2, . . . , etc., shown in FIG. 5A, may be positioned adjacent edge array section 525-0, e.g., adjacent array section 525-1, or medial in the array, e.g., array section 525-2, relative to one of two edge array sections positioned at the two ends of the array. The non-edge array sections 525-1 and 525-2 may be configured as shown at 425-1 and 425-2 and described in connection with the 1T1C memory array shown in FIGS. 4A and 4B.

In contrast, as shown in FIG. 5A, sensing component stripe 524-0 may include, for example, half as many 2T2C sense amplifiers, e.g., 506-0, 506-1, . . . , 506-4095, as the number of 1T1C sense amplifiers, e.g., 517-1-0, 517-1-1, . . . , 517-1-8191 in sensing component stripe 524-1. In addition, due to the 2T2C configuration of the sense amplifiers in sensing component stripe 524-0, as shown and described in more detail in connection with FIGS. 2A-2B and 3, each of the sense amplifiers is configured to have two sense lines, e.g., sense lines 505-0-1 and 505-0-2 for 2T2C sense amplifier 506-0, extending into edge array section 525-0 to be selectably coupled to a 2T2C memory cell in a row 519-0 of the edge array section 525-0. Accordingly, one of the complementary pair of sense lines may be utilized as a data line, e.g., sense line 505-0-1, for sensing a data value voltage of a selected 2T2C memory cell, e.g., 521-0-1, in row 519-0 and the other of the complementary pair of sense lines may be utilized as a reference sense line, e.g., sense line 505-0-2, for sensing a reference and/or residual voltage, e.g., an equilibrated or ground voltage, of the selected 2T2C memory cell, e.g., 521-0-2, in row 519-0 and/or on the sense line 505-0-2 coupled to the selected 2T2C memory cell.

By comparison, in some embodiments, a 1T1C sense amplifier, e.g., 517-1-0, of the second sensing circuitry, e.g., sensing component stripe 524-1, may be selectably coupled, via a sense line, e.g., 505-1-0, serving as a data line, to a memory cell, e.g., 518-0-0, in row 519-0 in the edge array section 525-0. The 1T1C sense amplifier, e.g., 517-1-0, of the second sensing circuitry also may be selectably coupled to a sense line, e.g., 505-1-0, in an adjacent array section, e.g., 525-1, as a reference sense line that is not coupled to a memory cell in the adjacent array section. In some embodiments, the operation may be performed on data sensed in a row, e.g., row 519-1, of the adjacent array section, e.g., 525-1, via a fourth sense line, e.g., 505-1-0, by the 1T1C sensing circuitry and the third sense line, e.g., 505-1-0, in the edge array section, e.g., 525-0, is a reference sense line that is not coupled to a memory cell.

Figure 5B:
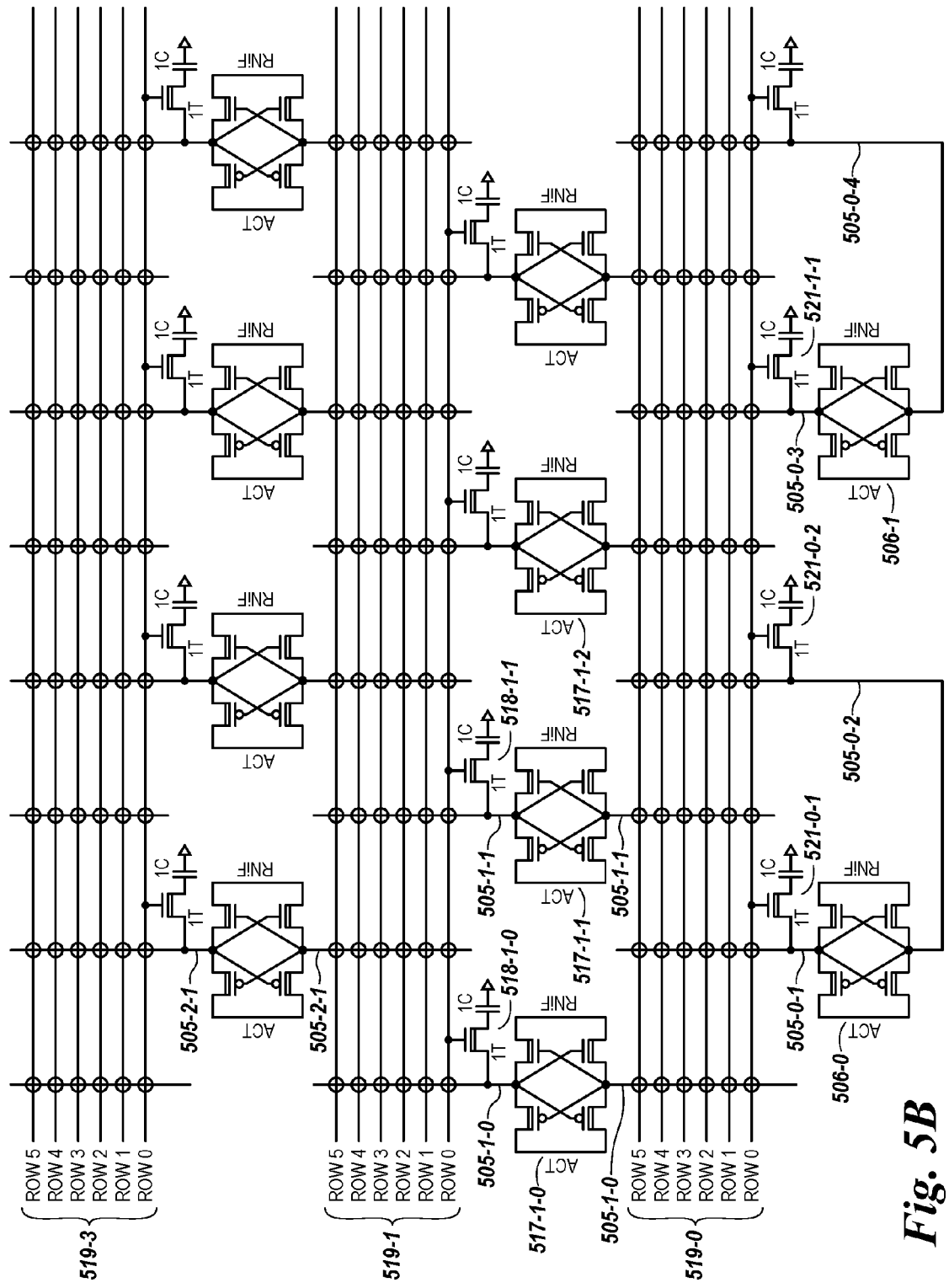
FIG. 5B is a schematic diagram illustrating an example of memory device circuitry of the edge array section in the combined 1T1C and 2T2C configuration in accordance with a number of embodiments of the present disclosure.

The 2T2C sense amplifier 506-0, among the other 2T2C sense amplifiers in sensing component stripe 524-0 for edge array section 525-0, can be enabled, e.g., fired, to sense and/or store voltage potentials from the 2T2C memory cell, e.g., as shown at 521-0-1 and 521-0-2 in FIG. 5B, by being coupled to an adjacent complementary pair of sense lines 505-0-1 and 505-0-2. In some embodiments, the complementary pair of sense lines, e.g., 505-0-1 and 505-0-2, for the 2T2C sense amplifier, e.g., 506-0, may be the same sense lines, e.g., 405-0-1 and 405-0-2, fabricated to be utilized for 1T1C sense amplifiers 417-0-1 and 417-0-2. As such, the 2T2C sense amplifier 506-0 in sensing component stripe 524-0 would be coupled in a 2T2C configuration to sense and/or store a data value from the 2T2C memory cell 521-0-1/521-0-2 without a reference sense line in an adjacent section of the array, e.g., when there is no adjacent array section available.

The 2T2C sense amplifier of the first sensing circuitry, e.g., sensing component stripe 524-0, may be configured to store data sensed from a 2T2C memory cell that is configured to store two bits of data. In comparison, the 1T1C sense amplifier of the second sensing circuitry, e.g., sensing component stripe 524-1, may be configured to store data sensed from a 1T1C memory cell that is configured to store one bit of data.

Configuring a memory array as such may enable otherwise unutilized memory cells and/or sense lines to be utilized for accessible data storage without increasing a size of the die upon which the memory cells, sense lines, sense amplifiers, and/or sensing component stripe would otherwise have been fabricated. In addition, a combination of 2T2C memory cells, e.g., 521-0-1/521-0-2, 521-1-1/521-1-2, . . . , etc., and 2T2C sense amplifiers, e.g., 506-0, 506-1, . . . , 506-4095, along with the associated sense lines, e.g., 505-0-1, 505-0-2, . . . , 505-0-8192, being in the same array section, e.g., edge array section 525-0, may provide memory cells that have a raw bit error rate (RBER) that is several orders of magnitude lower than that of 1T1C memory cells that extend into adjacent array sections, e.g., edge array section 425-0 and adjacent array section 425-1 as shown and described in connection with the 1T1C configuration in FIGS. 4A-4B.

Accordingly, as shown in and described further in connection with FIGS. 6A and 6B, the combination of the 2T2C memory cells and 2T2C sense amplifiers shown in and described in connection with the edge array sections in FIGS. 5A and 5B may be more reliable and/or robust, e.g., the voltage differential sensed by the 2T2C sense amplifiers may have a notably higher amplitude, as described herein. As such, the 2T2C memory cells and 2T2C sense amplifiers in the edge array sections may be utilized for storage and/or retrieval with a low RBER of data that enables functionality of particular, e.g., critical, components associated with a memory array.

For example, a memory array, e.g., a DRAM array as shown in and described further in connection with FIGS. 5A and 5B, may provide reliable ECC code and/or microcode storage, among storage of other types of coded instructions, on the die in the edge array section 525-0 and this may be provided at a small, e.g., no, additional cost, e.g., for increased die size. Moreover, as shown in and described further in connection with FIGS. 6A and 6B, because the 2T2C sense amplifiers are positioned at the edge of the array, e.g., in sensing component stripe 524-0, peripheral circuitry, e.g., components such as ECC circuitry 659 and/or a controller 640, among other possible components, may access this data, e.g., ECC code and/or microcode, at no die size cost without having to access the data through a back channel, e.g., a dedicated data bus. To enhance the reliability and/or accessibility of the storage and/or retrieval of the data, the data may be stored in a row, e.g., an edge row, of the edge array section, e.g., 525-0, that is adjacent and/or contiguous with the 2T2C sense amplifiers and/or the sensing component stripe of the edge array section.

Figure 6A:
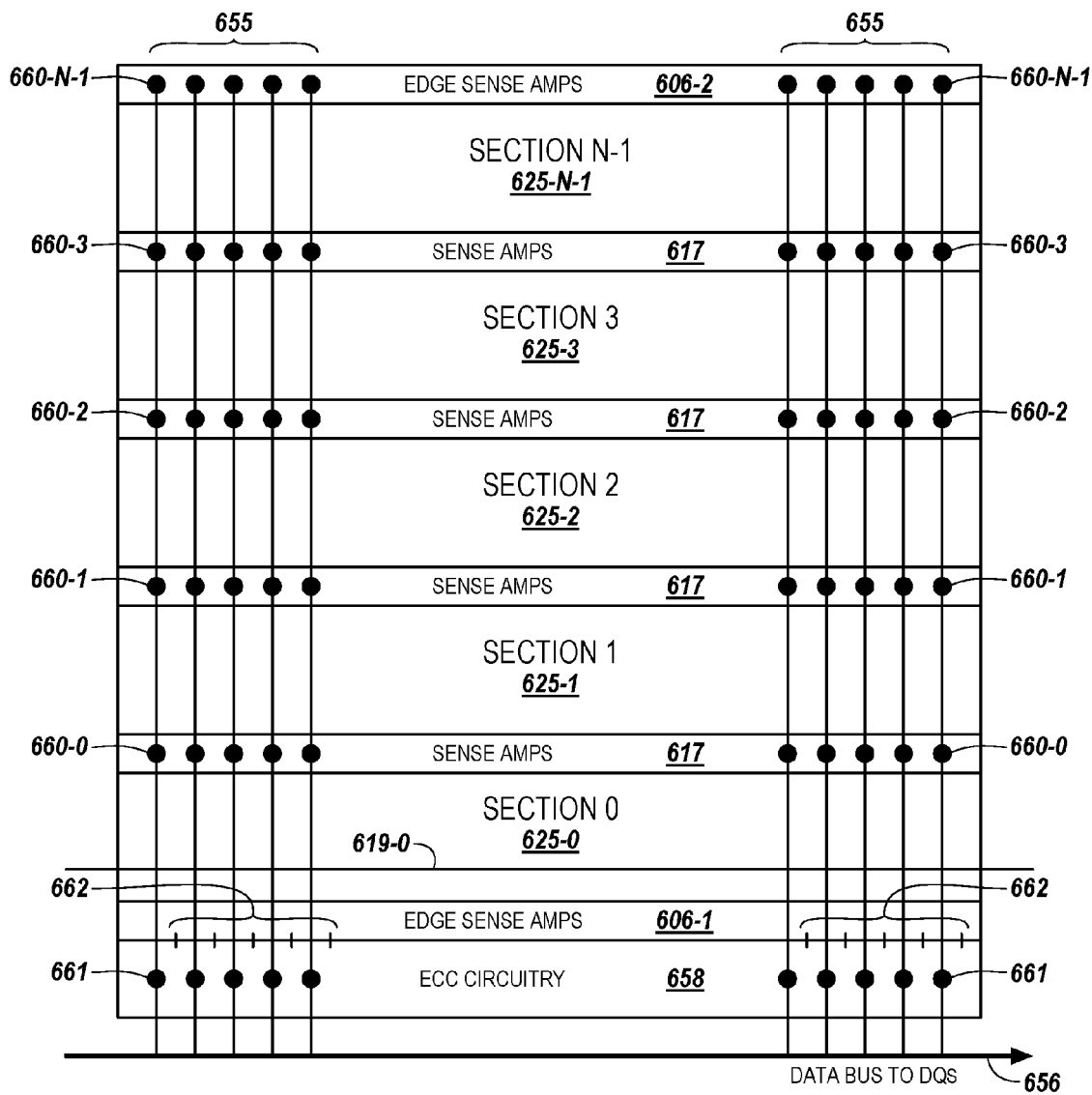
FIG. 6A is a block diagram of sections in a bank of a memory device with the edge array section in the combined 1T1C and 2T2C configuration configured to move error correction code (ECC) bits to ECC circuitry in accordance with a number of embodiments of the present disclosure.

FIG. 6A is a block diagram of sections, e.g., 625-0, 625-1, . . . , 625-N-1, in a bank of a memory device with the edge array section, e.g., 625-0, in the combined 1T1C and 2T2C configuration, e.g., as shown in and described in connection with FIGS. 5A and 5B, configured to move ECC bits to ECC circuitry, e.g., 658, in accordance with a number of embodiments of the present disclosure. The ECC bits may each be one or more data values stored as code bits to enable error correction by the ECC circuitry 658. In some embodiments, e.g., as shown in FIG. 6A, the ECC bits may be stored by and/or retrieved from an edge row 619-0 of memory cells in the edge array section 625-0 that may be adjacent and/or contiguous with the 2T2C edge sense amplifiers 606-1 of the edge array section that sense and store the ECC bits and/or the sensing component stripe for the 2T2C edge sense amplifiers 606-1.

In some embodiments, the edge array section 625-0 for ECC code bit storage and the ECC circuitry 658 may both be proximate, e.g., adjacent and/or contiguous, opposite edges of sensing component stripe, e.g., sensing component stripe 524-0 in FIG. 5A, with the ECC circuitry 658 being outside the edge array section 625-0. For example, the ECC circuitry 658 may be positioned adjacent an edge of the sensing component stripe 524-0 that is opposite an edge of the sensing component stripe 524-0 that is adjacent a nearest row, e.g., row 0 of rows 519-0 in FIG. 5B and/or edge row 619-0 in FIG. 6A, of the edge array section 625-0. In some embodiments, additional instructions (bits) may be stored and/or retrieved from a section at the opposite end of the array, e.g., section 625-N-1, that may be configured similarly to the combination of the 1T1C memory cells and 1T1C sense amplifiers with the 2T2C memory cells and 2T2C sense amplifiers described herein in connection with edge array section 625-0. In various embodiments, the ECC code and/or microcode may be further instructions sensed and/or stored by 2T2C edge sense amplifiers 606-2 of the edge array section 625-N-1 to enable the ECC circuitry just described and/or to enable one or more different components, e.g., the microcode engine in the controller 740 shown in FIG. 7 and described in connection with FIGS. 6B and 7.

As shown in FIG. 6A, a number of transfer lines 662, in various embodiments, may be configured to directly couple the 2T2C sense amplifiers in first sensing circuitry, e.g., sensing component stripe 524-0 that includes the 2T2C sense amplifiers, compute components, connections to sense lines, etc., positioned adjacent the edge row 619-0 to a component, e.g., the ECC circuitry 658, positioned adjacent the first sensing circuitry for movement of the instructions directly to the component to enable the performance of an operation, e.g., data error correction. For example, each transfer line 662 may be selectably coupled to one or more memory cell in the edge row 619-0 to enable parallel and/or sequential movement of a plurality of bits from particular memory cells and/or respective 2T2C sense amplifiers to intended input locations in the ECC circuitry 658 to enable a data error correction operation. Directly coupling the respective 2T2C sense amplifiers, e.g., in the sensing component stripe 524-0, via the transfer lines 662 to the intended input locations in the ECC circuitry 658 may increase the reliability, accessibility, and/or rate of such data movement, e.g., relative to data moved by the I/O lines 655 described below.

Figure 6B:
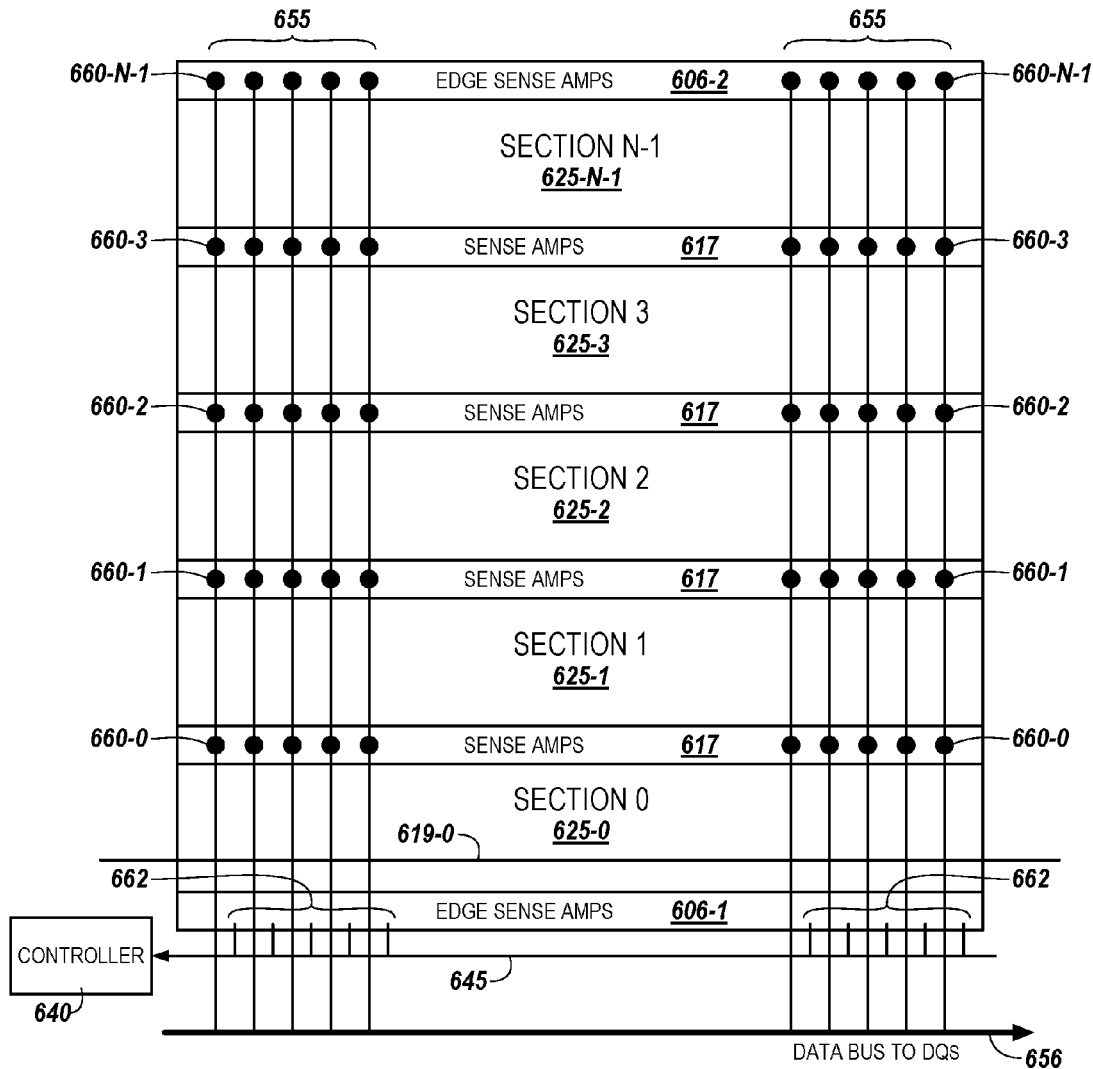
FIG. 6B is a block diagram of sections in a bank of a memory device with the edge array section in the combined 1T1C and 2T2C configuration configured to move microcode bits to a controller in accordance with a number of embodiments of the present disclosure.

Movement of data other than the data values stored as ECC code and/or microcode instructions to enable operation of components, e.g., the ECC circuitry 658 and/or the microcode engine in the controller 640 shown in FIG. 6B, may be enabled by a number of I/O lines 655. The number of I/O lines 655 may each selectably be shared by one or more 1T1C sense amplifiers in second sensing circuitry, e.g., sensing component stripes 524-1, 524-2, . . . , 524-N-1 that include the 1T1C sense amplifiers, connections to sense lines, etc., for movement of data values to the component for performance of the operation thereon.

The data may be selectably moved to the number of I/O lines 655 from one or more respective 1T1C sense amplifiers 617 in each sensing component stripe via a number of input connections 660-0, 660-1, . . . , 660-N-1 to each sensing component stripe. For example, the input connections may enable sequential movement of data from a plurality of sense amplifiers in the sensing component stripe to an input connection to a single I/O line 655 through implementation of a multiplexer (not shown). In some embodiments, the number of I/O lines 655 may be fabricated above and/or below a plane of, e.g., on top of or on the bottom of, the memory array sections, sensing circuitry, and/or ECC circuitry. In contrast, the transfer lines 662 may be fabricated in the same plane as the memory array sections, sensing circuitry, and/or ECC circuitry. Each of the I/O lines 655 may have an output connection 661 selectably coupled to the intended input locations in the ECC circuitry 658.

Hence, the 2T2C edge sense amplifiers 606-1 of the edge array section 625-0 may provide the ECC circuitry 658 with code bits via the transfer lines 662 to enable performance of the ECC operation, whereas the I/O lines 655 may provide the data on which the ECC operation is performed. Following performance of the ECC operation, in some embodiments, the output connections 661 of the ECC circuitry may function as input connections and the input connections 660-0, 660-1, . . . , 660-N−1 of the sensing component stripes may function as output connections to enable movement of data on which the ECC operation has been performed back to original or different locations, e.g., sections, rows, and/or memory cells, in the memory array.

Direction of the data to the intended input locations in the ECC circuitry 658 may, in some embodiments, be performed through implementation of the same or another multiplexer (not shown). In some embodiments, the I/O lines 655 may additionally or alternatively be coupled to a data bus 656, e.g., a 64 bit wide data bus, for movement of the data to DRAM DQs, which can correspond to the data bus 156 and 856 shown and described in connection with FIGS. 1 and 8, respectively.

FIG. 6B is a block diagram of sections in a bank of a memory device with the edge array section in the combined 1T1C and 2T2C configuration configured to move microcode bits to a controller in accordance with a number of embodiments of the present disclosure. The embodiment illustrated in FIG. 6B may, in various embodiments, represent at least a portion of the functionality embodied by and contained in the embodiment shown in and described in connection with FIG. 6A, with the additional functionality shown in and described in connection with FIG. 6B.

In some embodiments, the 2T2C edge sense amplifiers 606-1 of the edge array section 625-0 may enable movement of microcode bits via the transfer lines 662 directly to a data line 645 coupled to controller 640, e.g., a microcode engine in the controller as shown and described in connection with FIG. 7. As described in connection with FIG. 6A, the microcode bits may be stored by and/or retrieved from the edge row 619-0 of memory cells in the edge array section 625-0. The edge array section 625-0 may be adjacent and/or contiguous with the 2T2C edge sense amplifiers 606-1 of the edge array section and may sense and/or store the microcode bits in the sensing component stripe for the 2T2C edge sense amplifiers 606-1. The microcode bits moved via the transfer lines 662 and the data line 645 may be instructions utilized to enable performance of a microcode-directed operation, as directed and/or performed by the controller, e.g., by the microcode engine of controller 740 shown in FIG. 7.

Movement of data other than the data values stored as microcode instructions to enable the microcode-directed operation may be enabled by the number of I/O lines 655. For example, the I/O lines 655 may provide the data on which the microcode-directed operation is performed. In various embodiments, the I/O lines 655 may be selectably coupled, e.g., via a multiplexer (not shown), to the data line 645 for movement the data on which the microcode-directed operation is performed and/or the I/O lines 655 may additionally or alternatively be coupled to the data bus 656 for movement of the data to DRAM DQs.

Figure 7:
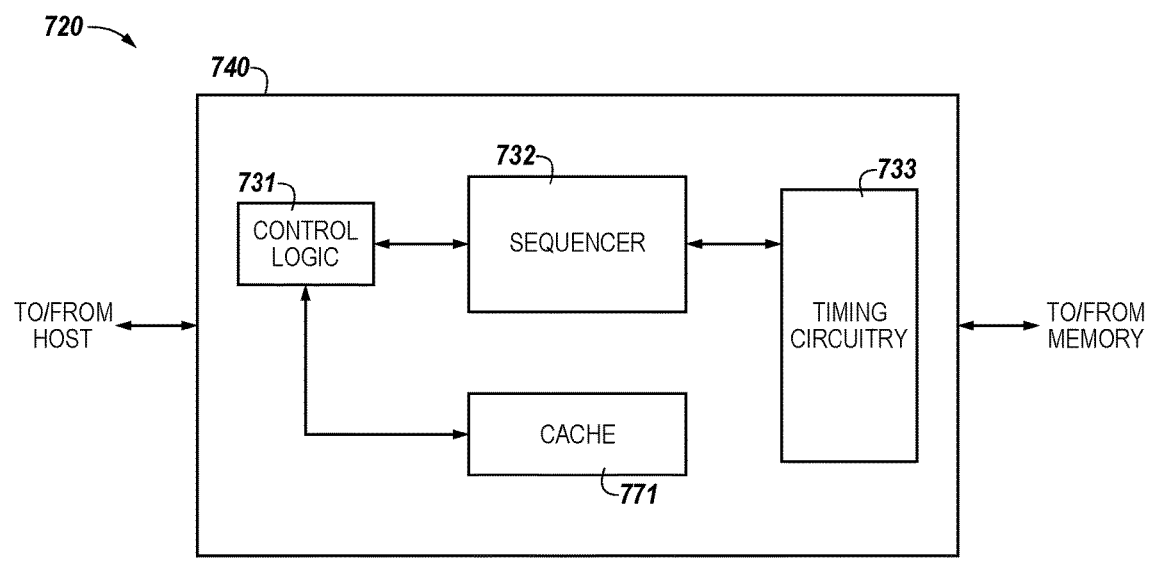
FIG. 7 is a block diagram in greater detail of a controller in accordance with a number of embodiments of the present disclosure.

FIG. 7 is a block diagram in greater detail of controller 140 and 840 shown in and described in connection with FIG. 1 and FIG. 8, and elsewhere herein, in accordance with a number of embodiments of the present disclosure. In the example shown in FIG. 7, the controller 740 is shown to include control logic 731, sequencer 732, and timing circuitry 733 as part of a controller 740 of a memory device 720. Memory device 720 can include a controller 740 on each bank of the memory device and can be referred to as a bank process control unit (BPCU).

In the example shown in FIG. 7, the control logic 731 may be in the form of a microcode engine responsible for fetching and executing machine instructions, e.g., microcode instructions, from an array of memory cells, e.g., an array as array 830 in FIG. 8. The sequencer 732 may also be in the form of a number of microcode engines and/or ALU circuitry. Alternatively, the control logic 731 may be in the form of a very large instruction word (VLIW) type processing resource and the sequencer 732, and the timing circuitry 733 may be in the form of state machines and transistor circuitry.

The control logic 731 may receive microcode instructions (bits) from the memory array 830, e.g., as shown in and described in connection with FIG. 6B, via the data line 645. In some embodiments, the microcode instructions may be initially stored in cache 771. The control logic 731 may decode the microcode instructions into function calls, e.g., microcode function calls (uCODE), implemented by the sequencers 732. The microcode function calls can be the operations that the sequencer 732 receives and executes to cause the memory device 720 to perform particular compute and/or logical operations, e.g., using sensing circuitry, such as sensing circuitry 850 in FIG. 8. The timing circuitry 733 may provide timing to coordinate performance of the compute and/or logical operations and be responsible for providing conflict free access to the arrays such as array 830 shown in FIG. 8.

As described in connection with FIG. 8, the controller 740 may be coupled to sensing circuitry 850 and/or additional logic circuitry 870, including cache, buffers, sense amplifiers, compute components, extended row address (XRA) latches, and/or registers, associated with arrays of memory cells via control lines and data paths shown in FIGS. 2A-2B and 8. As such, the sensing circuitry 850 and logic 870 shown in FIG. 8 can be associated with, e.g., coupled to, the arrays of memory cells 830 in various ways, including by data lines 625. The controller 740 may control regular DRAM compute operations for the arrays such as a read, write, copy, and/or erase operations, etc. Additionally, however, microcode instructions retrieved and executed by the control logic 731 and the microcode function calls received and executed by the sequencer 732 can cause sensing circuitry 850 shown in FIG. 8 to perform additional logical operations such as addition, multiplication, or, as a more specific example, Boolean operations such as an AND, OR, XOR, etc., which are more complex than regular DRAM read and write operations. In various embodiments, compute and/or logical operations may be performed using the sense amplifier 206 and/or compute component 231 of the sensing circuitry shown in and described in connection with FIGS. 2A-2B. Hence, in this memory device 720 example, microcode instruction execution, compute operations, and/or logical operations may be performed on the memory device 720 as enabled by the microcode instructions (bits) being moved as described herein from the array of memory cells 830 to the controller 740 for execution by the microcode engine.

As such, the control logic 731, sequencer 732, and timing circuitry 733 may operate to generate sequences of operation cycles for a DRAM array. In the memory device 720 example, each sequence may be designed to perform operations, such as a Boolean logical operations AND, OR, XOR, etc., which together achieve a specific function. For example, the sequences of operations may repetitively perform a logical operation for a one (1) bit add in order to calculate a multiple bit sum. Each sequence of operations may be fed into a first in/first out (FIFO) buffer coupled to the timing circuitry 733 to provide timing coordination with the sensing circuity 850 and/or additional logic circuitry 870 associated with the array of memory cells 830, e.g., DRAM arrays, shown in FIG. 8.

In the example memory device 720 shown in FIG. 7, the timing circuitry 733 may provide timing and provide conflict free access to the arrays from, for example, four (4) FIFO queues. In this example, one FIFO queue may support array computation, one may be for instruction fetch, one for microcode, e.g., uCODE, instruction fetch, and one for DRAM I/O. Both the control logic 731 and the sequencer 732 can generate status information, which can be routed back to a bank arbiter via a FIFO interface. The bank arbiter may aggregate this status data and report it back to a host 810.

FIG. 8 is a block diagram of an apparatus in the form of a computing system 859 including a memory device 820 in accordance with a number of embodiments of the present disclosure. As used herein, a memory device 820, controller 840, memory array 830, sensing circuitry 850, and/or logic 870 might also be separately considered an "apparatus."

In previous approaches, data may be transferred from a memory array and sensing circuitry, e.g., via a bus comprising I/O lines, to a processing resource such as a processor, microprocessor, and/or compute engine, which may comprise ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access, e.g., firing of a column decode signal, in order to transfer data from sense lines onto I/O lines, e.g., local I/O lines, transferring the data peripheral to the array, which may be transferred to a cache in a host, and providing the data to the peripheral compute circuitry.

In a number of embodiments, sensing circuitry 850 can be used to perform logical operations using data stored in an array of memory cells, e.g., array 830, as inputs and store the results of the logical operations back to the array 830 without transferring data via a sense line address access, e.g., without firing a column decode signal. As such, various compute functions can be performed using, and within, sensing circuitry 850 rather than (or in association with) being performed by processing resources external to the sensing circuitry, e.g., by a processor associated with host 810 and/or other processing circuitry, such as ALU circuitry, located on device 820, e.g., on controller 840 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines. In contrast, in a number of embodiments of the present disclosure, sensing circuitry 850 may be configured to perform logical operations on data stored in memory array 830 and store the result back to the memory array 830 without enabling an I/O line, e.g., a local I/O line, coupled to the sensing circuitry 850. Additional logic circuitry 870 can be coupled to the sensing circuitry 850 and can be used to store, e.g., cache and/or buffer, results of operations described herein.

The sensing circuitry 850 can be formed on pitch with the memory cells of the array. In some instances, circuitry of processing resource(s), e.g., a compute engine, may not conform to pitch rules associated with a memory array. For example, the memory cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and/or memory density, for example. A number of embodiments of the present disclosure can include the control circuitry and/or the sensing circuitry, e.g., including sense amplifiers and/or compute components, as described herein, being formed on pitch with the memory cells of the array and being configured to, e.g., being capable of performing, compute functions, e.g., memory and/or PIM operations, on pitch with the memory cells. The sensing circuitry can, in some embodiments, be capable of performing data sensing and compute functions and at least temporary storage, e.g., caching, of data local to the array of memory cells.

PIM capable device operations can use bit vector based operations. As used herein, the term "bit vector" is intended to mean a number of bits on a bit vector memory device, e.g., a PIM device, stored in a row of an array of memory cells and/or in sensing circuitry. Thus, as used herein a "bit vector operation" is intended to mean an operation that is performed on a bit vector that is a portion of virtual address space and/or physical address space, e.g., used by a PIM device. In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space.

In some embodiments, a bit vector memory device, e.g., a PIM device capable of performing bit vector operations, may perform logical operations. For example, PIM devices capable of bit vector operations operate on bit vectors. As used herein, the term "bit vector" is intended to mean a physically contiguous number of bits on a bit vector memory device, e.g., PIM device, whether physically contiguous in rows, e.g., horizontally oriented, or columns, e.g., vertically oriented, in an array of memory cells. Thus, as used herein, a "bit vector operation" is intended to mean an operation that is performed on a bit vector that is a contiguous portion (also referred to as "chunk") of virtual address space, e.g., used by a bit vector operation capable memory device. For example, a chunk of virtual address space may have a bit length of 256 bits. A chunk may or may not be contiguous physically to other chunks in the virtual address space. Such bit vector operations may be enabled, e.g., performed, by a combination of a sense amplifier 206 and a compute component 231, e.g., in a 2T2C configuration, as shown in and described in connection with FIGS. 2A-2B. As the reader will appreciate, while a DRAM memory device configuration and/or a DRAM bit vector operation, e.g., performed by a PIM device, is discussed with regard to some examples presented herein, embodiments are not limited to a DRAM and/or PIM DRAM implementation.

For example, a row of virtual address space in the PIM device may have a bit length of 16K bits, e.g., corresponding to 16K complementary pairs of memory cells in a DRAM configuration. Sensing circuitry 850, as described herein, for such a 16K bit row may include a corresponding 16K processing elements, e.g., compute components as described herein, formed on pitch with the sense lines selectably coupled to corresponding memory cells in the 16 bit row. A compute component in the PIM device may operate as a one bit vector processing element on a single bit of the bit vector of the row of memory cells sensed by the sensing circuitry 850, e.g., sensed by and/or stored in a sense amplifier 206 paired with the compute component 231, as described further in connection with FIG. 2B and elsewhere herein.

As such, in a number of embodiments, circuitry external to array 830 and sensing circuitry 850 is not needed to perform compute functions as the sensing circuitry 850 can perform the appropriate memory and/or logical operations in order to perform such compute functions without the use of an external processing resource. Therefore, the sensing circuitry 850 may be used to complement and/or to replace, at least to some extent, such an external processing resource (or at least the bandwidth consumption of such an external processing resource).

However, in a number of embodiments, the sensing circuitry 850 may be used to perform operations, e.g., to execute instructions, in addition to operations performed by an external processing resource, e.g., host 810. For instance, host 810 and/or sensing circuitry 850 may be limited to performing only certain logical operations and/or a certain number of logical operations.

Enabling an I/O line can include enabling, e.g., turning on, a transistor having a gate coupled to a decode signal, e.g., a column decode signal, and a source/drain coupled to the I/O line. However, embodiments are not limited to performing operations using sensing circuitry, e.g., 850, without enabling column decode lines of the array. Whether or not local I/O lines are used in association with performing operations via sensing circuitry 850, the local I/O line(s) may be enabled in order to transfer a result to a suitable location other than back to the array 830, e.g., to an external register.

As described herein, the controller 840 can be configured to direct movement to the component, e.g., ECC circuitry 658 and/or data line 645, among other possibilities, of the instructions from the first sensing circuitry, e.g., sensing component stripe 525-0, and/or to direct movement to the component of the data value from the second sensing circuitry, e.g., sensing component stripe 525-1. In various embodiments, the data value may be stored in the edge array section, e.g., in row 519-0 of section 525-0, and/or the data value may be stored in the adjacent array section, e.g., in row 519-1 of section 525-1. The data sensed by the first sensing circuitry, e.g., sense amplifiers of sensing component stripe 525-0, may include microcode instructions stored by memory cells of the edge row, e.g., row 519-0, that may be retrieved and executed by a microcode engine that is part of the controller 840 positioned on a chip on which the plurality of rows is positioned.

As shown in FIG. 5A, for example, the number of 2T2C sense amplifiers, e.g., 506-0, 506-1, . . . , 506-4095, in sensing component stripe 524-0 may be half the number of 1T1C sense amplifiers, e.g., 417-1-0, 417-1-1, . . . , 417-1-8191, in sensing component stripe 524-1. However, the number of bits in the instructions to enable an operation by a component may be even less than the sense and storage capacity of the number of sense amplifiers in sensing component stripe 524-0. For example, the ECC code bits that are utilized to enable ECC operations by the ECC circuitry 658 may be less than, for example, the 4096 2T2C sense amplifiers and/or the corresponding 4096 2T2C memory cells per row of section 525-0. Accordingly, the coded instructions described herein, e.g., ECC code and/or microcode, among other types of coded instructions, may be stored by a number of memory cells, e.g., in section 525-0, that is at most half a number of memory cells, e.g., in section 525-1, that store data values on which the operation is performed.

In some embodiments, the edge array section 525-0 may have a same number of rows of memory cells as the adjacent array section 525 and half a number of memory cells, e.g., memory cells 521, usable for storage of data bits per row of memory cells relative to the adjacent array section, e.g., memory cells 518, as shown in FIG. 5B. In some embodiments, the instructions may be stored as a number of bits by half a number of usable memory cells, e.g., memory cells 521 in section 525-0, in the edge row, e.g., 519-0, relative to the number of memory cells, e.g., 518, usable for storage of the data bits per row, e.g., in sections 625-0, 625-1, . . . , 625-N−1 of FIGS. 6A and 6B.

The computing system 859 illustrated in FIG. 8 can include a host 810 coupled, e.g., connected, to memory device 820, which includes the memory array 830. Host 810 can be a host system such as a personal laptop computer, a desktop computer, a tablet computer, a digital camera, a smart phone, or a memory card reader, among various other types of hosts. Host 810 can include a system motherboard and backplane and can include a number of processing resources, e.g., one or more processors, microprocessors, or some other type of controlling circuitry. The computing system 859 can include separate integrated circuits or both the host 810 and the memory device 820 can be on the same integrated circuit. The computing system 859 can be, for instance, a server system and/or a high performance computing (HPC) system or a portion of either. Although the example shown in FIG. 8 illustrates a system having a Von Neumann architecture, embodiments of the present disclosure can be implemented in non-Von Neumann architectures, which may not include one or more components, e.g., CPU, ALU, etc., often associated with a Von Neumann architecture.

For clarity, description of the computing system 859 has been simplified to focus on features with particular relevance to the present disclosure. For example, in various embodiments, the memory array 830 can be a DRAM array, SRAM array, STT RAM array, PCRAM array, TRAM array, RRAM array, NAND flash array, and NOR flash array, for instance. The memory array 830 can include memory cells arranged in rows coupled by access lines (which may be referred to herein as word lines or select lines) and columns coupled by sense lines (which may be referred to herein as data lines or digit lines). Although a single memory array 830 is shown in FIG. 8, embodiments are not so limited. For instance, memory device 820 may include a number of memory arrays 830, e.g., a number of banks of DRAM cells, NAND flash cells, etc., in addition to a number of sections, e.g., subarrays, as described herein.

The memory device 820 can include address circuitry 842 to latch address signals provided over a data bus 856, e.g., an I/O bus from the host 810, by I/O circuitry 844, e.g., provided to external ALU circuitry and to DRAM DQs via local I/O lines and global I/O lines. As used herein, DRAM DQs can enable input of data to and output of data from a bank, e.g., from and/or to the controller 840 and/or host 810, via a bus, e.g., data bus 156, 656, and/or 856. During a write operation, a voltage (high=1, low=0) can be applied to a DQ, e.g., a pin. This voltage can be translated into an appropriate signal and stored in a selected memory cell. During a read operation, a data value read from a selected memory cell can appear at the DQ once access is complete and the output is enabled, e.g., by the output enable signal being low. At other times, DQs can be in a high impedance state, such that the DQs do not source or sink current and do not present a signal to the system. This also may reduce DQ contention when two or more devices, e.g., banks, share the data bus.

Status and exception information can be provided from the controller 840 on the memory device 820 to the host 810 through, for example, a bus 857, e.g., a high speed interface (HSI) out-of-band (OOB) bus. The bus 857 can be used by the host 110 to dispatch commands, e.g., PIM commands, to a plurality of memory devices 820-1, . . . , 820-N (not shown) to store those program instructions within a given bank of a memory device.

Address signals are received through address circuitry 842 and decoded by a row decoder 846 and a column decoder 852 to access the memory array 830. Data can be sensed (read) from memory array 830 by sensing voltage and/or current changes on sense lines (digit lines in FIGS. 2A-2B and 3), for example, using a number of sense amplifiers of the sensing circuitry 850. A sense amplifier can read and latch data values from a page, e.g., a row, of data from the memory array 830. Additional compute components, e.g., as shown at 231 and described in connection with FIG. 2B, can be coupled to the sense amplifiers and can be used in combination with the sense amplifiers to sense, store, e.g., cache and buffer, perform compute functions, e.g., operations, on, and/or move data. The I/O circuitry 844 can be used for bi-directional data communication with host 810 over the data bus 856, e.g., a 64 bit wide data bus. The write circuitry 848 can be used to write data to the memory array 830.

Controller 840, e.g., bank control logic and sequencer, can decode signals, e.g., commands, provided by control bus 854 from the host 810. These signals can include chip enable signals, write enable signals, and/or address latch signals that can be used to control operations performed on the memory array 830, including data sense, data store, data movement, data compute (PIM), data read, data write, and/or data erase, among other operations. Control circuitry having instructions, e.g., stored in hardware, such as an application-specific integrated circuit (ASIC), firmware, and/or software embodiments, can be associated with the controller 840. In various embodiments, the controller 840 can be responsible for issuing instructions from the host 810 and accessing the memory array 830. The controller 840 can be a state machine, a sequencer, or some other type of controller. The controller 840 can control shifting data, e.g., right or left, in a row of an array, e.g., memory array 830.

Examples of the sensing circuitry 850 are described in connection with FIGS. 2A-2B. For instance, in various embodiments, the sensing circuitry 850 can include a number of sense amplifiers and/or a number of compute components. A compute component may serve as an accumulator and can be used to perform operations as directed by a controller 840 and/or a respective section controller (not shown) of each section, e.g., on data associated with complementary sense lines. In some embodiments, a compute component can be coupled to each sense amplifier, e.g., as shown at 231 and 206, respectively, in FIG. 2B, within the sensing circuitry 850 in each respective sensing component stripe coupled to a section, e.g., in sensing component stripes 124-0 and 124-1 coupled respectively to sections 125-0 and 125-1 shown in and described in connection with FIG. 1 and elsewhere. However, embodiments are not so limited. For example, in some embodiments, there may not be a 1:1 correlation between the number of sense amplifiers and compute components. For example, there may be more than one sense amplifier per compute component or more than one compute component per sense amplifier, which may vary between sections, banks, etc.

In a number of embodiments, the sensing circuitry 850 can be used to perform operations using data stored in memory array 830 as input and participate in movement of the data for reading, writing, logical, copy, transfer, and/or storage operations to a different location in the memory array 830 without transferring the data via a sense line address access, e.g., without firing a column decode signal. As such, various compute functions (PIM operations) can be performed using, and within, the sensing circuitry 850 rather than (or in association with) being performed by processing resources external to the sensing circuitry 850, e.g., by a processor associated with host 810 and other processing circuitry, such as ALU circuitry, located on device 820, such as on controller 840 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines.

In contrast, as described herein, sensing circuitry 850 is configured to perform operations on data stored in memory array 830 and to store the result back to the memory array 830 without enabling a local I/O line and global I/O line coupled to the sensing circuitry 850. The sensing circuitry 850 can be formed on pitch with the memory cells of the array. Additional peripheral sense amplifiers and/or logic 870, e.g., section controllers that each execute instructions for performing a respective operation, can be coupled to the sensing circuitry 850. The sensing circuitry 850 and the peripheral sense amplifier and/or logic 870 can cooperate in performing operations, according to some embodiments herein.

Logic, as described herein, is intended to mean hardware, e.g., in the form of an application specific integrated circuit (ASIC), and/or firmware to implement one or more particular functions. One example of logic may include a state machine, as described herein. Another example may include an embedded processing resource. Logic can include instructions, e.g., PIM commands and/or instructions, such as ECC code and/or microcode, that can be sent to a memory device having processing capabilities to implement logical operations. As such, the logic may be associated with, e.g., located at and/or connected to, the host 810, the controller 840, and/or the memory array 830, e.g., at logic 870.

Hence, in a number of embodiments, circuitry external to memory array 830 and sensing circuitry 850 is not needed to perform compute functions, as the sensing circuitry 850 can perform the appropriate operations in order to perform such compute functions, e.g., in a sequence of instructions, without the use of an external processing resource. Therefore, the sensing circuitry 850 may be used to complement or to replace, at least to some extent, such an external processing resource (or at least reduce the bandwidth consumption of transfer of data to and/or from such an external processing resource).

In a number of embodiments, the sensing circuitry 850 may be used to perform operations, e.g., to execute a sequence of instructions, in addition to operations performed by an external processing resource, e.g., host 810. For example, either of the host 810 and the sensing circuitry 850 may be limited to performing only certain operations and/or a certain number of operations.

Enabling a local I/O line and/or global I/O line can include enabling, e.g., turning on, activating, a transistor having a gate coupled to a decode signal, e.g., a column decode signal, and a source/drain coupled to the I/O line. However, embodiments are not limited to not enabling a local I/O line and/or global I/O line. For example, in a number of embodiments, the sensing circuitry 850 can be used to perform operations without enabling column decode lines of the array. However, the local I/O line(s) and/or global I/O line(s) may be enabled in order to transfer a result to a suitable location other than back to the memory array 830, e.g., to an external register.

Embodiments described herein provide a method of operating an apparatus that may be in the form of a computing system 857 including a memory device 820, e.g., as shown in and described in connection with FIG. 8 and elsewhere herein, for utilization of data stored in an edge section of an array of memory cells. As described herein, the method can include operating the memory device for sensing an instruction bit for performance of an operation, the instruction bit stored in an edge row, e.g., 619-0, of an edge array section, e.g., 625-0, of memory cells and storing the sensed instruction bit in a first sense amplifier, e.g., 2T2C sense amplifier 506-0, adjacent the edge row. The method can include sensing a data bit on which the operation is to be performed, the data bit stored in a different row selected from the edge array section and an adjacent array section of the memory cells, e.g., rows 1-5 in 519-0 or rows 0-5 in 519-1 shown in FIG. 5B, and storing the sensed data bit in a second sense amplifier, e.g., 1T1C sense amplifier 517-1-0 shown in FIG. 5B, positioned between the edge array section and the adjacent array section. The method can include moving the instruction bit and the data bit to a component, e.g., ECC circuitry 658 and/or controller 640 coupled to data line 645, outside the edge array section and adjacent the first sense amplifier. The method can further include performing, by the component, the operation on the moved data bit based on the moved instruction bit.

In some embodiments, the method may further include sensing a first number of instruction bits stored in the edge row, e.g., 519-0, of memory cells via a corresponding number of pairs of sense lines, e.g., sense lines 505-0-1 and 505-0-2, each pair of sense lines coupled to a respective sense amplifier, e.g., 2T2C sense amplifier 506-0. The method may further include sensing a second number of data bits stored in the different row of memory cells via a corresponding number of sense lines, e.g., 505-1-0 and 505-1-1, each sense line coupled to a respective second sense amplifier, e.g., 1T1C sense amplifiers 517-1-0 and 517-1-1. The method may further include storing the first number of sensed instruction bits in no more than half a number of first sense amplifiers relative to a number of second sense amplifiers used for storing the second number of sensed data bits.

The method may further include storing firmware instructions as instruction bits for performance of the operation, e.g., by the component, that are inaccessible to a read operation, write operation, and/or erase operation, among other data processing operations performed on the memory device 820. As such, the instructions for performance of operations important to functionality of the computing system may be protected from such data processing operations.

The method may further include performing the operation by the component on a chip on which the edge array section 625-0 and the adjacent array section 625-1 are positioned, as directed by an on-chip controller 840. As such, the operation may be performed without direction by an off-chip device, e.g., host 810.

While example embodiments including various combinations and configurations of sensing circuitry, sense amplifiers, compute components, microcode engines, e.g., including control logic, a sequencer, a timing component, etc., and/or controllers, etc., have been illustrated and described herein, embodiments of the present disclosure are not limited to those combinations explicitly recited herein. Other combinations and configurations of the sensing circuitry, sense amplifiers, compute components, microcode engines, e.g., including control logic, a sequencer, a timing component, and/or controllers, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory device, comprising:
   an edge array section at an edge of a plurality of sections of memory cells, wherein a first row of the memory cells in the edge array section is an edge row of the plurality of sections;
   first sensing circuitry positioned adjacent the edge row and selectably coupled to the edge array section, the first sensing circuitry including a first sense amplifier coupled to a first sense line to which a first memory cell of the edge array section is coupled; and
   wherein the first sense amplifier is coupled to a second sense line of the edge array section to which the first memory cell is coupled, the second sense line to serve as a reference for a data value sensed via the first sense line;

an adjacent array section of the plurality of sections of memory cells, wherein the adjacent array section is positioned on an opposite edge of the edge array section relative to the first sensing circuitry;

second sensing circuitry positioned between and selectably coupled to the edge and adjacent array sections, the second sensing circuitry including a second sense amplifier coupled to the edge array section via a third sense line and coupled to the adjacent array section via a fourth sense line;

an I/O line selectably shared by a plurality of second sense amplifiers in the second sensing circuitry for sequential movement of a plurality of data values, corresponding to the plurality of second sense amplifiers, to a component to enable performance of an operation thereon; and coded instructions stored by memory cells of the edge row of the edge array section that are retrieved and executed by a microcode engine that is part of a controller positioned on a chip on which a plurality of rows of the memory device is positioned to enable the performance of the operation by the component.

2. The apparatus of claim 1, wherein the apparatus further comprises:
the component configured to perform the operation on a data value sensed by the second sensing circuitry; wherein the component is:
positioned proximate the first sensing circuitry and outside the edge array section at the edge of the plurality of sections; and
configured to perform the operation based on instructions stored in the edge row and sensed by the first sensing circuitry; and
the controller configured to direct movement to the component of the instructions from the first sensing circuitry and to direct movement to the component of the data value from the second sensing circuitry.

3. The apparatus of claim 2, wherein the data value is stored in the edge array section.

4. The apparatus of claim 1, wherein data sensed by the first sensing circuitry includes the coded instructions stored by memory cells of the edge row.

5. The apparatus of claim 1, wherein the apparatus further comprises the coded instructions that are stored by a number of memory cells that is at most half a number of memory cells that store data values on which the operation is performed.

6. The apparatus of claim 1, wherein the edge array section comprises:
a same number of rows of memory cells in a single edge array section as in the adjacent array section;
the single edge array section includes half a number of memory cells usable for storage of data bits per row of memory cells relative to the adjacent array section; and
the single edge array section stores the coded instructions as a number of bits to enable completion of the performance of the operation by the component by half a number of usable memory cells in a single edge row relative to the number of memory cells usable for storage of the data bits per row in the adjacent array section.

7. The apparatus of claim 1, wherein the first sensing circuitry further comprises a compute component coupled to the first sense amplifier, the first sense line, and the second sense line of the edge array section.

8. The apparatus of claim 1, wherein:
the first sensing circuitry is included in a first sensing component stripe physically associated with the edge array section; and
the second sensing circuitry is included in a second sensing component stripe physically associated with the edge array section and the adjacent array section.

9. The apparatus of claim 1, wherein the memory device further comprises a number of transfer lines that directly couple a corresponding number of first sense amplifiers in the first sensing circuitry positioned adjacent the edge row to a component positioned adjacent the first sensing circuitry for movement of the instructions directly to the component to enable the performance of the operation.

* * * * *